United States Patent
Watanabe et al.

(10) Patent No.: US 9,537,288 B2
(45) Date of Patent: Jan. 3, 2017

(54) SEMICONDUCTOR LASER DEVICE ASSEMBLY

(71) Applicant: Sony Corporation, Tokyo (JP)

(72) Inventors: Hideki Watanabe, Kanagawa (JP);
Shunsuke Kono, Kanagawa (JP);
Masaru Kuramoto, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/390,689

(22) PCT Filed: Apr. 3, 2013

(86) PCT No.: PCT/JP2013/060163
§ 371 (c)(1),
(2) Date: Oct. 3, 2014

(87) PCT Pub. No.: WO2013/153999
PCT Pub. Date: Oct. 17, 2013

(65) Prior Publication Data
US 2015/0085891 A1    Mar. 26, 2015

(30) Foreign Application Priority Data
Apr. 9, 2012 (JP) ................. 2012-088627

(51) Int. Cl.
*H01S 3/08*   (2006.01)
*H01S 5/12*   (2006.01)
(Continued)

(52) U.S. Cl.
CPC ............ *H01S 5/12* (2013.01); *B82Y 20/00* (2013.01); *H01S 5/06253* (2013.01); *H01S 5/14* (2013.01); *H01S 5/141* (2013.01); *H01S 5/143* (2013.01); *H01S 5/323* (2013.01); *H01S 5/32341* (2013.01); *H01S 3/105* (2013.01); *H01S 5/0657* (2013.01); *H01S 5/101* (2013.01); *H01S 5/22* (2013.01); *H01S 5/3216* (2013.01); *H01S 5/34333* (2013.01)

(58) Field of Classification Search
CPC ............ H01S 5/141; H01S 5/14; H01S 5/143; H01S 5/323; H01S 5/32341
USPC ..................... 372/102, 98, 43.01
See application file for complete search history.

(56) References Cited

U.S. PATENT DOCUMENTS 4,913,525 A * 4/1990 Asakura ............... G02B 5/1809
359/559
6,343,091 B1 * 1/2002 Funakawa ............. H01S 3/0812
372/20
(Continued)

FOREIGN PATENT DOCUMENTS

JP    63-110783    5/1988
JP    63-114293    5/1988
(Continued)

OTHER PUBLICATIONS

Tobias Schlauch, et al., Femtosecond passively modelocked diode laser with intracavity dispersion management, Optics Express 24316, Nov. 8, 2010, vol. 18, No. 23. (9 pages).

(Continued)

*Primary Examiner* — Kinam Park
(74) *Attorney, Agent, or Firm* — Chip Law Group

(57) ABSTRACT

A semiconductor laser device assembly includes (A) a semiconductor laser element and (B) a diffraction grating that configures an external resonator, returns diffraction light other than zero-th order diffraction light to the semiconductor laser element, and outputs the zero-th order diffraction light to the outside. An extension direction of a diffraction surface of the diffraction grating and a main vibration direction of a field of a laser beam incident on the diffraction grating are substantially parallel to each other.

13 Claims, 15 Drawing Sheets

(51) Int. Cl.
*H01S 5/323* (2006.01)
*H01S 5/14* (2006.01)
*B82Y 20/00* (2011.01)
*H01S 5/0625* (2006.01)
*H01S 3/105* (2006.01)
*H01S 5/065* (2006.01)
*H01S 5/10* (2006.01)
*H01S 5/22* (2006.01)
*H01S 5/32* (2006.01)
*H01S 5/343* (2006.01)

(56) References Cited

U.S. PATENT DOCUMENTS

2011/0075689 A1* 3/2011 Miyata .................. H01S 5/0654
372/20
2012/0002271 A1* 1/2012 Kuramoto ............. H01S 5/1064
359/344

FOREIGN PATENT DOCUMENTS

| | | |
|---|---|---|
| JP | 03-119778 | 5/1991 |
| JP | 03-145174 | 6/1991 |
| JP | 06-132598 | 5/1994 |
| JP | 11-103124 | 4/1999 |
| JP | 2005-310298 | 11/2005 |
| JP | 2009-021488 | 1/2009 |
| JP | 2011-018779 | 1/2011 |
| JP | 2011-077523 | 4/2011 |
| JP | 2011-091209 | 5/2011 |
| JP | 2012-015266 | 1/2012 |

OTHER PUBLICATIONS

International Search Report issued in connection with International Patent Application No. PCT/JP2013/060163, dated May 14, 2013. (5 pages).

* cited by examiner

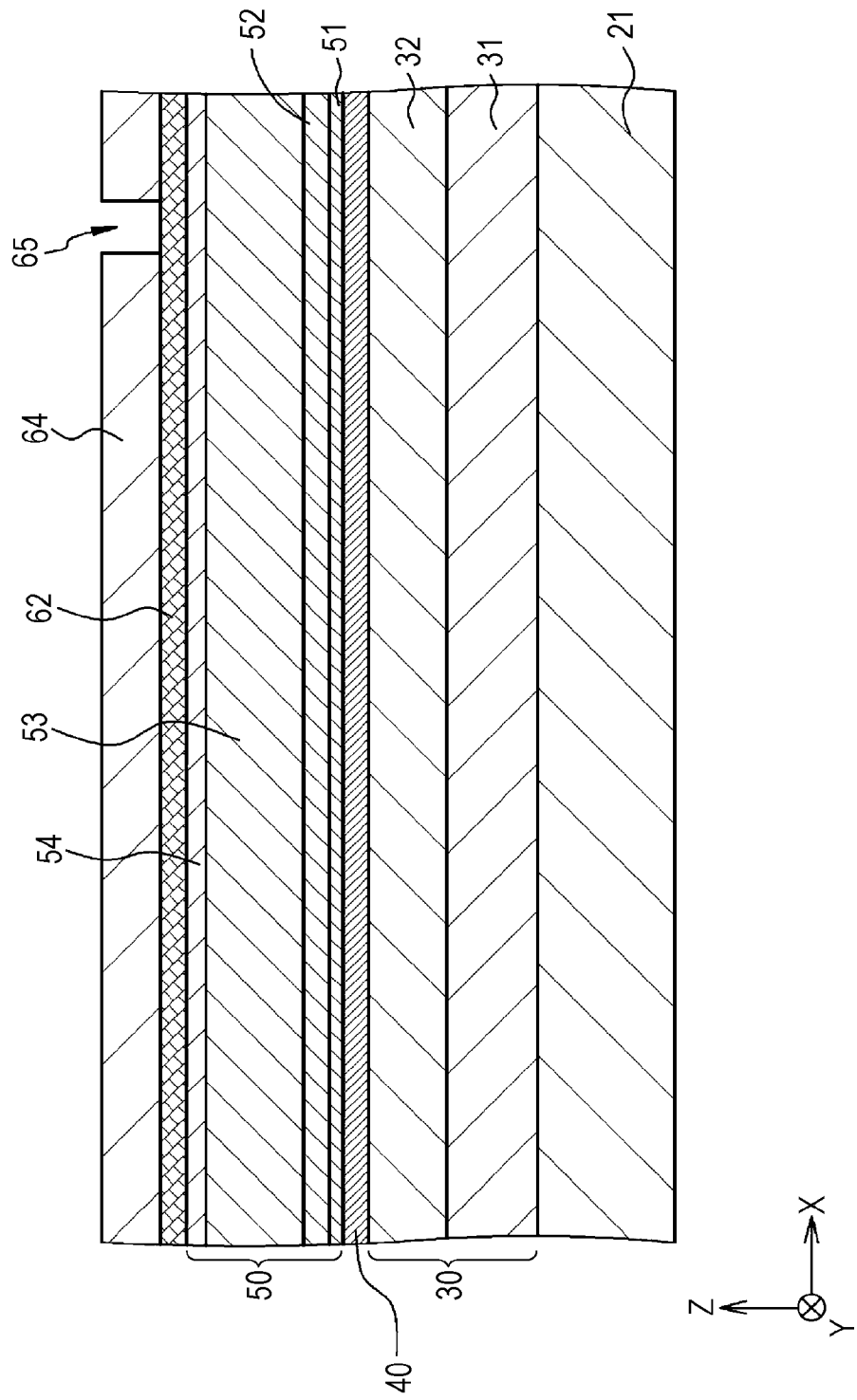

SEMICONDUCTOR LASER DEVICE ASSEMBLY

CROSS REFERENCES TO RELATED APPLICATIONS

The present application is a national stage of International Application No. PCT/JP2013/060163 filed on Apr. 3, 2013 and claims priority to Japanese Patent Application No. 2012-088627 filed on Apr. 9, 2012, the disclosure of which is incorporated herein by reference.

BACKGROUND

The present disclosure relates to a semiconductor laser device assembly.

Recently, an ultrashort pulse/ultrahigh output laser has been actively used for making a study of an advanced scientific domain using a laser beam where a pulse time width is at an atto-second level or a femtosecond level. In addition, in the ultrashort pulse laser, in addition to a scientific interest called the elucidation of ultrafast phenomena such as picoseconds and femtoseconds, an application study to practical use such as minute processing or two-photon imaging has been actively performed using high peak power. In addition, a high-output ultrashort-pulse semiconductor laser element that is configured from a GaN compound semiconductor and has a light emission wavelength in a 405 nm band has been expected as a light source of a volume-type optical disk system expected as a next-generation optical disk system following a Blu-ray optical disk system, a light source required in fields such as a medical field and a bio-imaging field, and a coherent light source covering an entire region of a visible light region.

As the ultrashort pulse/ultrahigh output laser, a titanium/sapphire laser has been known. However, the titanium/sapphire laser is expensive and is a large-scale solid-state laser light source, which results in becoming a main factor that disturbs a technical spread. In addition, a different solid-state laser to oscillate consecutive light is necessary for excitation and energy efficiency is not necessarily high. Besides, it is not easy for a large-scaled resonator to realize mechanical stability and specialized knowledge is required on maintenance. If the ultrashort pulse/ultrahigh output laser can be realized by a semiconductor laser element (LD), large downsizing, price reduction, low consumption power, and high stability are enabled, which results in a breakthrough on promoting the extensive spread in these fields.

Meanwhile, peak power of a light pulse can be represented by an average output/(repetition frequency×pulse width). Therefore, it is effective to increase the average output to realize the high peak power. In the related art, when an external resonator structure is configured by a diffraction grating, technology for returning first order diffraction light to a semiconductor laser element and extracting zero-th order diffraction light to the outside is known. Generally, in the diffraction grating, diffraction efficiency at a blaze wavelength is highest and diffraction efficiency of polarized light (for convenience, referred to as "parallel polarized light") in which a vibration direction of a field in a laser beam (hereinafter, it may be simply referred to as the "field") and rulings of the diffraction grating are parallel to each other is lower than diffraction efficiency in polarized light (for convenience, referred to as "orthogonal polarized light") in which the vibration direction of the field and the rulings of the diffraction grating are orthogonal to each other. In addition, technology for making orthogonal polarized light incident on the diffraction grating and improving diffraction efficiency is known from JP 3-145174 A, for example.

CITATION LIST

Patent Document

Patent Document 1: JP 3-145174 A

Non-Patent Document

Non-Patent Document 1: T. Schlauch et al., Optics Express, Vol. 18, p 24136 (2010)

SUMMARY

Problems to be Solved by the Invention

However, it is important to output a large amount of zero-th order diffraction light to the outside to increase the average output. That is, it is effective to remove diffraction light of high order of second order or more and decrease first order diffraction efficiency. In addition, it is effective to make a wavelength of a laser beam incident on the diffraction grating and a blaze wavelength different from each other. Nevertheless, in the technologies disclosed in the latest Japanese Published Unexamined Patent Applications, only efficiency (reflection diffraction efficiency) of light returning to the semiconductor laser element is considered and the orthogonal polarized light is made to be incident on the diffraction grating at the blaze wavelength. However, technology using the parallel polarized light or technology for making the wavelength of the laser beam incident on the diffraction grating and the blaze wavelength different from each other to decrease the diffraction efficiency to decrease the diffraction efficiency when the external resonator structure is configured by the diffraction grating is not investigated by the inventors.

Accordingly, an object of the present disclosure is to provide a semiconductor laser device assembly having a configuration and a structure in which an external resonator structure is configured by a diffraction grating or an optical element and an average output can be increased.

Solutions to Problems

A semiconductor laser device assembly according to a first aspect of the present disclosure for achieving the above-described object includes:

(A) a semiconductor laser element; and (B) a diffraction grating that configures an external resonator, returns diffraction light other than zero-th order diffraction light to the semiconductor laser element, and outputs the zero-th order diffraction light to the outside, wherein an extension direction of a diffraction surface of the diffraction grating and a main vibration direction of a field of a laser beam incident on the diffraction grating are substantially parallel to each other.

A semiconductor laser device assembly according to a second aspect of the present disclosure for achieving the above-described object includes:

(A) a semiconductor laser element; and (B) an optical element that configures an external resonator, returns a part of an incident laser beam to the semiconductor laser element, and outputs the remainder of the incident laser beam to the outside, wherein extraction efficiency of a laser beam component having a field included in a plane parallel to a principal surface of the semiconductor laser element to the outside is higher than extraction efficiency of a laser beam component having a field orthogonal to the principal surface of the semiconductor laser element to the outside.

Effects of the Invention

In the semiconductor laser device assembly according to the first aspect of the present disclosure, the extension direction of the diffraction surface of the diffraction grating and the main vibration direction of the field of the laser beam incident on the diffraction grating are substantially parallel to each other. In addition, in the semiconductor laser device assembly according to the second aspect of the present disclosure, the extraction efficiency of the laser beam component having the field of which the vibration direction is included in the plane parallel to the principal surface of the semiconductor laser element to the outside is higher than the extraction efficiency of the laser beam component having the field of which the vibration direction is included in the plane orthogonal to the principal surface of the semiconductor laser element to the outside. For this reason, an average output of the laser beam output from the semiconductor laser element to the outside can be increased. In addition, because a pulse laser having a high peak output in a 400 nm wavelength band can be realized by a mode synchronization semiconductor laser element, the spread of an ultrashort pulse light source of femtosecond order can be promoted, a pulse laser of several tens of watts or more can be realized by a mode synchronization semiconductor laser element simple substance, and downsizing and cost reduction of a system can be realized.

Additional features and advantages are described herein, and will be apparent from the following Detailed Description and the figures.

BRIEF DESCRIPTION OF THE FIGURES

FIG. 13 is a schematic partial cross-sectional view of a substrate and the like to describe a method of manufacturing the mode synchronization semiconductor laser element according to the first example, subsequent to FIG. 12B.

DETAILED DESCRIPTION

Figure 1A:
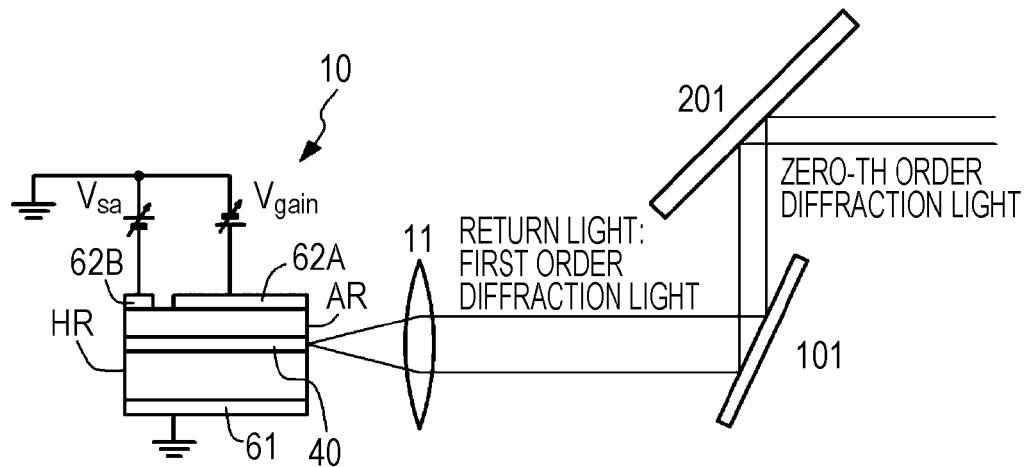
FIGS. 1A and 1B are a conceptual diagram illustrating a semiconductor laser device assembly according to a first example and a diagram schematically illustrating an arrangement of various components in the semiconductor laser device assembly according to the first example to measure light intensity, respectively.

Hereinafter, the present disclosure will be described on the basis of examples with reference to the drawings. However, the present disclosure is not limited to the examples and various numerical values or materials in the examples are exemplary. The following description is made in the following order.
1. Overall description of semiconductor laser device assemblies according to first and second aspects of the present disclosure
2. First example (semiconductor laser device assemblies according to the first and second aspects of the present disclosure)
3. Second example (modification of the first example)
4. Third example (another modification of first example)
5. Fourth example (modifications of the first to third examples) and others
[Overall Description of Semiconductor Laser Device Assemblies According to First and Second Aspects of Present Disclosure]

As a method of generating a light pulse having a time width of about several picoseconds using a semiconductor laser element, a mode synchronization method is known. In the mode synchronization method, active mode synchronization in which gain or loss is modulated at a cycle equal to a lap time in an external resonator structure and passive mode synchronization in which a saturable absorber showing a non-linear optical response is provided in the semiconductor laser element and is operated exist. However, the passive mode synchronization is more suitable for generating a light pulse having a pulse time width of about several picoseconds or less. In a semiconductor laser device assembly according to a first aspect or a second aspect of the present disclosure, a semiconductor laser element can be configured to be driven to execute an active mode synchronization operation or a passive mode synchronization operation. Hereinafter, a "mode synchronization semiconductor laser element" indicates a semiconductor laser element driven to execute the passive mode synchronization operation unless there is some issues involved.

In the semiconductor laser device assembly according to the first aspect of the present disclosure including the preferred configuration, a reciprocal number $N_0$ (also referred to as a ruling number) of a diffraction grating cycle of the diffraction grating is preferably $1.0 \times 10^3$ mm$^{-1}$ or more. Specifically, 1200 mm$^{-1}$ to 4500 mm$^{-1}$, preferably, 2400 mm$^{-1}$ to 3600 mm$^{-1}$ can be exemplified as the value of $N_0$.

In addition, in the semiconductor laser device assembly according to the first aspect of the present disclosure including the preferred configuration described above, the diffraction grating can be configured from a diffraction grating of a reflection type and a blaze type. In this case, a blaze wavelength $\lambda_B$ in the diffraction grating is $\lambda_B < \lambda + 50$ (nm) with respect to a wavelength $\lambda$ of a laser beam incident on the diffraction grating, is preferably the wavelength $\lambda$ of the laser beam incident on the diffraction grating, and is more preferably $\lambda_B < \lambda - 100$ (nm). In this case, the diffraction grating can be arranged in a Littrow arrangement (also referred to as a Littman arrangement). Alternatively, in the semiconductor laser device assembly according to the first aspect of the present disclosure including the preferred configuration described above, the laser beam emitted from the semiconductor laser element can collide with the diffraction grating, diffraction light (e.g., first order diffraction light) other than the zero-th order diffraction light in the laser beam having collided with the diffraction grating can return to the semiconductor laser element, and the zero-th order diffraction light in the laser beam having collided with the diffraction grating can be output to the outside.

Alternatively, in the semiconductor laser device assembly according to the first aspect of the present disclosure including the preferred configuration described above, in diffraction gratings other than the diffraction grating of the blaze type, when a diffraction grating incidence angle of a laser beam (wavelength: $\lambda$ nm) emitted from the semiconductor laser element and incident on the diffraction grating is set to $\Phi_{in}$, an emission angle is set to $\Phi_{out}$, a reciprocal number of a diffraction grating cycle of the diffraction grating is $N_0$ (unit: mm$^{-1}$), and order of the diffraction light is set to n, a relation of the following expression (0) can be satisfied, so that the n-th order diffraction light in the laser beam having collided with the diffraction grating can return to the semiconductor laser element and the zero-th order diffraction light can be output to the outside. More specifically, in the case in which only plus first order diffraction light is extracted, when a sign of an angle of a clockwise direction with respect to a normal of the diffraction grating is positive and a laser beam is incident at a positive angle, an emission angle $\Phi_{out}$ of minus first order diffraction light may be $-90°$ or less (e.g., $-100°$ or $-110°$), an emission angle $\Phi_{out}$ of plus second order diffraction light may be $90°$ or more (e.g., $100°$ or $110°$), and an emission angle $\Phi_{out}$ of plus first order diffraction light may be more than $-90°$ and less than $90°$. Therefore, the reciprocal number $N_0$ of the diffraction grating cycle, the wavelength $\lambda$, and the incidence angle $\Phi_{in}$ satisfying relations of the following expressions (1), (2), and (3) may be selected. Here, the expression (1) is an expression regarding the emission angle $\Phi_{out}$ of the plus first order diffraction light (n=+1), the expression (2) is an expression regarding the emission angle $\Phi_{out}$ of the minus first order diffraction light (n=−1), and the expression (3) is an expression regarding the emission angle $\Phi_{out}$ of the plus second order diffraction light (n=+2).

$$\Phi_{out} = \sin^{-1}[N_0 \cdot n \cdot \lambda - \sin(\Phi_{in})] \quad (0)$$

$$-90 < \Phi_{out} = \sin^{-1}[N_0 \cdot (+1) \cdot \lambda - \sin(\Phi_{in})] < 90 \quad (1)$$

$$\Phi_{out} = \sin^{-1}[N_0 \cdot (-1) \cdot \lambda - \sin(\Phi_{in})] \leq -90 \quad (2)$$

$$\Phi_{out} = \sin^{-1}[N_0 \cdot (+2) \cdot \lambda - \sin(\Phi_{in})] \geq 90 \quad (3)$$

In the semiconductor laser device assembly according to the first aspect of the present disclosure including the preferred configuration and form described above, a dispersion compensation optical system which the laser beam emitted from the semiconductor laser element is incident on or is emitted from can be further included and the diffraction grating can configure a part of the dispersion compensation optical system. In this case, the dispersion compensation optical system can be configured from a reflection mirror, the laser beam emitted from the semiconductor laser element can collide with the diffraction grating, the diffraction light (e.g., the first order diffraction light) other than the zero-th order diffraction light in the laser beam having collided with the diffraction grating can be incident on the reflection mirror, can be reflected by the reflection mirror, can be incident on the diffraction grating, and can return to the semiconductor laser element, and the zero-th order diffraction light in the laser beam having collided with the diffraction grating can be output to the outside. Also, in the semiconductor laser device assembly according to the second aspect of the present disclosure including the preferred configuration described above, a dispersion compensation optical system which the laser beam emitted from the semiconductor laser element is incident on or is emitted from can be further included and an optical element can configure a part of the dispersion compensation optical system. In this case, the dispersion compensation optical system can be configured from a reflection mirror, the laser beam emitted from the semiconductor laser element can collide with the optical element, a part of laser beam having collided with the optical element can be incident on the reflection mirror, can be reflected by the reflection mirror, can be incident on the optical element, and can return to the semiconductor laser element, and the remaining light in the laser beam having collided with the optical element can be output to the outside. The reflection mirror is configured from a plane reflection mirror, for example. Specifically, the reflection mirror is configured from a dielectric multilayer reflection mirror. In addition, the dispersion compensation optical system preferably further includes a condensing unit (specifically, a lens) that is arranged between the diffraction grating and the reflection mirror. By changing a distance between the diffraction grating and the condensing unit in a state in which a distance between the condensing unit and the reflection mirror is fixed, a group velocity dispersion value in the dispersion compensation optical system can be changed.

In addition, in the semiconductor laser device assembly according to the first aspect of the present disclosure including the preferred configuration and form described above, a wavelength selecting unit that selects a wavelength of the zero-th order diffraction light emitted to the outside can be further included. Also, in the semiconductor laser device assembly according to the second aspect of the present disclosure including the preferred configuration described above, a wavelength selecting unit that selects a wavelength of light emitted to the outside can be further included. In addition, the wavelength selecting unit can include a diffraction grating and an aperture to select first order or more diffraction light emitted from the diffraction grating. The aperture can be configured from a transmissive liquid crystal display device having multiple segments. Alternatively, the wavelength selecting unit can be configured from a band-pass filter and can be configured from a long path filter or a prism. The band-pass filter can be obtained by laminating a dielectric thin film having low permittivity and a dielectric thin film having high permittivity. In addition, an incidence angle of a pulsed laser beam on the band-pass filter is changed, so that a wavelength of the laser beam emitted from the band-pass filter can be selected.

Meanwhile, in the semiconductor laser element that generates a light pulse, when the light pulse is generated/amplified, the number of carriers in an active medium changes in a very short time of sub-picoseconds to picoseconds. Because the temporal change of the number of carriers changes an energy distribution of the carriers determining the wavelength of the generated/amplified light, the wavelength changes in duration of the light pulse. As a result, a large number of undesired wavelength components are included. That is, the laser beam emitted from the mode synchronization semiconductor laser element is in a noisy state. Phenomena caused by the change of the number of carriers include self-phase modulation. However, in the mode synchronization semiconductor laser element, a spectrum of a light output shows a long wave shift by the self-phase modulation. It is experimentally determined that a long wave shift component forms a coherent pulse. In the case of the mode synchronization semiconductor laser element, a wavelength component of a pulsed laser beam emitted through an external resonator is extracted by the wavelength selecting unit and is output to the outside, so that fluctuation of light intensity in duration of the emitted laser beam can be removed and the laser beam output to the outside has a desired wavelength. A time width of a pulse can be shortened, coherence of the laser beam can be improved, the laser beam can be compressed in a state in which the high throughput is maintained, and high peak power can be obtained. Generally, as compared with a short wave component, a long wave component has small noise and a pure wavelength component. As a result, a laser beam optimal for use in various technical fields can be provided.

In the mode synchronization semiconductor laser element, the spectrum of the light output shows the long wave shift by the self-phase modulation. However, a degree of the long wave shift shown by the spectrum can be investigated by continuously oscillating the mode synchronization semiconductor laser element and evaluating the spectrum of the light output. In the spectrum after the long wave shift, when an envelope of the spectrum decreases to a half value of a peak corresponding to the wavelength after the shift, a spectrum width given by the half value of the envelope can be used as the wavelength of the laser beam output to the outside. Meanwhile, when the envelope of the spectrum is continuous to a different peak without decreasing to the half value of the peak, a spectrum component between a wavelength giving a minimum value of the envelope and a wavelength giving a half value of the envelope or a spectrum component between a wavelength giving a minimum of the envelope and a wavelength giving a minimum value of the envelope can be used as the wavelength of the laser beam output to the outside.

In the semiconductor laser device assembly including the wavelength selecting unit, between the mode synchronization semiconductor laser element and the diffraction grating or the optical element (hereinafter, they may be referred to as the "diffraction grating and the like"), an imaging unit to form an image of a light emission end face of the mode synchronization semiconductor laser element on the diffraction grating and the like can be provided. The imaging unit can be configured from a lens. However, the present disclosure is not limited thereto and a concave mirror and a combination of the concave mirror and a lens can be used as the imaging unit. In this case, a laser beam that is emitted from the light emission end face of the mode synchronization semiconductor laser element and is incident on (collides with) the diffraction grating and the like is not a parallel light beam. For this reason, even though a mechanical vibration is applied to the external resonator, positions of the emission end face and image formation thereof are not changed in a range in which a condensing light beam is not deviated from an opening of an image forming lens. Therefore, a mode synchronization operation can be suppressed from becoming unstable. In this case, when a length of a horizontal direction of a laser beam on the light emission end face of the mode synchronization semiconductor laser element is set to $L_1$ and a length of a horizontal direction of an image of the light emission end face of the mode synchronization semiconductor laser element formed on the diffraction grating and the like is set to $L_2$, $1 \times 10 \leq L_2/L_1 \leq 1 \times 10^2$, preferably, $20 \leq L_2/L_1 \leq 50$ is satisfied. Alternatively, a lens to make the laser beam from the mode synchronization semiconductor laser element become parallel light can be arranged between the mode synchronization semiconductor laser element and the diffraction grating and the like.

In the semiconductor laser device assembly according to the first aspect of the present disclosure including the preferred configuration and form described above, extraction efficiency ($\text{Eff}_{TM}$) of a laser beam component having a field of which a vibration direction is included in a plane parallel to a principal surface of the semiconductor laser element to the outside is higher than extraction efficiency ($\text{Eff}_{TE}$) of a laser beam component having a field of which a vibration direction is included in a plane orthogonal to the principal surface of the semiconductor laser element to the outside, specifically, $2 \leq \text{Eff}_{TM}/\text{Eff}_{TE}$ can be satisfied. The above description can be applied similarly to the semiconductor laser device assembly according to the second aspect of the present disclosure, by changing the diffraction grating to the optical element.

In addition, in the semiconductor laser device assembly according to the first aspect of the present disclosure including the preferred configuration and form described above, a half-wavelength plate that is arranged between the semiconductor laser element and the diffraction grating can be further included. When an axial direction of the semiconductor laser element is set to an X direction, a thickness direction is set to a Z direction, and a width direction is set to a Y direction, a main vibration direction of a field of the laser beam emitted from the semiconductor laser element is included in an XY plane, and a main vibration direction of a field of a laser beam having passed through the half-wavelength plate is included in an XZ plane. When the extension direction of the diffraction surface of the diffraction grating is projected on a plane equivalent to a YZ plane, the extension direction of the diffraction surface of the diffraction grating can be substantially parallel to the Z direction. If various optical elements (e.g., a mirror and the like) exist between the semiconductor laser element and the diffraction grating and the like, directions of a coordinate system (X, Y, Z) of a three-dimensional space in the semiconductor laser element and a coordinate system (x, y, z) of a three-dimensional space in the diffraction grating and the like can be mismatched with each other. In this case, the coordinate system (x, y, z) of the three-dimensional space in the diffraction grating and the like is appropriately converted, so that the coordinate system (x, y, z) of the three-dimensional space in the diffraction grating can be made to be matched with the coordinate system (X, Y, Z) of the three-dimensional space in the semiconductor laser element. "When the extension direction of the diffraction surface of the diffraction grating is projected on a plane equivalent to a YZ plane" means that the coordinate system is appropriately converted. This is applicable to the following description.

In addition, in the present disclosure, when the half-wavelength plate is not included, when an axial direction of the semiconductor laser element is set to an X direction, a thickness direction is set to a Z direction, and a width direction is set to a Y direction, a main vibration direction of a field of the laser beam emitted from the semiconductor laser element is included in an XY plane. When the extension direction of the diffraction surface of the diffraction grating is projected on a plane equivalent to a YZ plane, the extension direction of the diffraction surface of the diffraction grating can be substantially parallel to the Y direction.

Alternatively, in the present disclosure, when the half-wavelength plate is not included, the semiconductor laser element is supported by a supporting member. When an axial direction of the semiconductor laser element is set to an X direction, a thickness direction is set to a Z direction, and a width direction is set to a Y direction, a main vibration direction of a field of the laser beam emitted from the semiconductor laser element is included in an XY plane. A normal of a semiconductor laser element supporting surface of the supporting member is parallel to the Y direction. When the extension direction of the diffraction surface of the diffraction grating is projected on a plane equivalent to a YZ plane, the extension direction of the diffraction surface of the diffraction grating can be substantially parallel to the Y direction.

Hereinafter, the semiconductor laser device assembly according to the first aspect of the present disclosure including the preferred configuration and form described above may be simply referred to as the "first aspect of the present disclosure", the semiconductor laser device assembly according to the second aspect of the present disclosure including the preferred configuration and form described above may be simply referred to as the "second aspect of the present disclosure", and the semiconductor laser device assemblies according to the first and second aspects of the present disclosure including the preferred configuration and form described above may be collectively referred to as the "present disclosure".

In the semiconductor laser device assembly according to the first aspect of the present disclosure, the laser beam emitted from the semiconductor laser element includes a laser beam component (for convenience, referred to as "a field parallel laser beam component") having a field of which a vibration component is included in a virtual plane parallel to an XY plane (a principal surface of the semiconductor laser element) and a laser beam component (for convenience, referred to as "a field orthogonal laser beam component") having a field of which a vibration component is included in a virtual plane orthogonal to the XY plane (the principal surface of the semiconductor laser element). Here, a value (ratio) of (field parallel laser beam component/field parallel laser beam component+field orthogonal laser beam component) changes according to the configuration and the structure of the semiconductor laser element. For example, in a semiconductor laser element configured from a GaN compound semiconductor, the value is almost "1". In the semiconductor laser device assembly according to the first aspect of the present disclosure, the extension direction of the diffraction surface of the diffraction grating and the main vibration direction of the field of the laser beam incident on the diffraction grating are substantially parallel to each other. Here, the "main vibration direction" depends on the configuration and the structure of the semiconductor laser element, for example. This means that $0.8 \leq$(field parallel laser beam component/field parallel laser beam component+field orthogonal laser beam component))$\leq 1.0$ is satisfied. In addition, the "substantially parallel" means that $|\eta|<45°$, preferably, $|\eta| \leq 10°$ is satisfied when an angle formed by the vibration direction of the field and the extension direction of the diffraction surface of the diffraction grating is set to $\eta$.

In the present disclosure, the semiconductor laser element is preferably configured to have a laminated structure formed by sequentially laminating a first compound semiconductor layer configured from a GaN compound semiconductor and having a first conductive type, a third compound semiconductor layer (active layer) configured from a GaN compound semiconductor and including a light emission region, and a second compound semiconductor layer configured from a GaN compound semiconductor and having a second conductive type different from the first conductive type.

Meanwhile, when energies per pulse are the same, peak power of a light pulse increases when a pulse time width decreases and a non-linear phenomenon is developed more conspicuously. Therefore, a narrow pulse time width can be exemplified as one performance index of an ultrashort pulse light source. A titanium/sapphire laser of the passive mode synchronization that generates a light pulse having a pulse time width of about 10 femtoseconds is sold at the present time. Meanwhile, in a semiconductor laser element that is operated on the basis of the passive mode synchronization, a pulse time width of a quantum well laser of a current injection type is generally about 1 to 2 picoseconds. Because a gain band is sufficiently wide in the semiconductor laser element, the semiconductor laser element potentially has the ability of generating a light pulse of sub-picoseconds. However, any reported example for a generation of the light pulse of the sub-picoseconds is rarely known.

In driving of the semiconductor laser element based on a mode synchronization method, as a main factor disturbing generation of a light pulse in which a pulse time width is sub-picosecond or less, a chirp affecting a light pulse according to pulse generation can be exemplified. In the semiconductor laser element, a carrier density of an active layer (gain unit) temporally changes according to the pulse generation. As a result, a refractive index of the active layer changes. For this reason, a frequency of the light pulse generated by the semiconductor laser element changes in duration of the pulse. The frequency change is referred to as a chirp. When the chirp is large, it is difficult to arrange a phase at each frequency of a light pulse moving around an inner portion of a resonator and it is difficult to decrease a pulse time width.

In order to resolve a problem when it is difficult to decrease the pulse time width due to the chirp, a method of providing a dispersion compensation optical system in an external resonator is known. The method is used widely in the titanium/sapphire laser of the mode synchronization. However, there are not many reported examples in the semiconductor laser element operated on the basis of the mode synchronization. Because the method does not depend on a kind of a gain medium or a saturable absorber or an excitation method, an application range of the method is wide and the method is advantageous. In Non-Patent Document 1 "T. Schlauch et al., Optics Express, Vol. 18, p 24136 (2010)", an attempt to control the pulse time width of the light pulse generated from the semiconductor laser operated on the basis of the mode synchronization by the dispersion compensation optical system using the diffraction grating is reported. Here, in Non-Patent Document 1, it is reported that a spectrum of a light pulse to be generated changes depending on a dispersion compensation amount. However, a change is not shown for the pulse time width and a light pulse in which the pulse time width is picoseconds or less is not generated.

For this reason, in order to provide the semiconductor laser device assembly of the current injection type having the configuration and the structure in which an ultrashort pulse laser beam can be output, the semiconductor laser element is preferably configured from a mode synchronization semiconductor laser element of a current injection type in which a light density is $1\times10^{10}$ watt/cm$^2$ or more, preferably, $1.4\times10^{10}$ watt/cm$^2$ or more and a carrier density is $1\times10^{19}$/cm$^3$ or more. In addition, the dispersion compensation optical system which the laser beam emitted from the mode synchronization semiconductor laser element is incident on and is emitted from is preferably included. Such a configuration is referred to as a "semiconductor laser device assembly of a first configuration including the dispersion compensation optical system".

Alternatively, the semiconductor laser element is preferably configured from a mode synchronization semiconductor laser element of a current injection type and the dispersion compensation optical system which the laser beam emitted from the mode synchronization semiconductor laser element is incident on and is emitted from is preferably included. When a group velocity dispersion value of the dispersion compensation optical system is changed monotonously from a first predetermined value GVD$_1$ to a second predetermined value GVD$_2$ (however, $|GVD_1|<|GVD_2|$), a pulse time width of a laser beam output from the mode synchronization semiconductor laser element to the outside (the outside of a system) preferably decreases, is more than a minimum value PW$_{min}$, and increases. Changing the group velocity dispersion value monotonously means that the group velocity dispersion value is increased monotonously in the case of GVD$_1$<GVD$_2$ and means that the group velocity dispersion value is decreased monotonously in the case of GVD$_1$>GVD$_2$. Such a configuration is referred to as a "semiconductor laser device assembly of a second configuration including the dispersion compensation optical system".

In the semiconductor laser element, when a light power density and a carrier density of an active layer (gain unit) in the semiconductor laser element are more than specific values, carries are consumed by stimulated emission. As a result, a refractive index in the active layer changes dynamically and an oscillation spectrum is widened. Such a phenomenon is referred to as self-phase modulation. An increase in the oscillation spectrum width by the self-phase modulation contributes to narrowing the pulse time width, an appropriate spectrum width is obtained by applying appropriate group velocity dispersion to the self-phase modulation by the dispersion compensation optical system, and a light pulse in a sub-picosecond band can be generated. Such a characteristic is similar to a feature of soliton/mode synchronization viewed when the self-phase modulation and the appropriate group velocity dispersion interact in a resonator and the above method is very effective as a method of narrowing the time width of the generated light pulse to the sub-picosecond (e.g., 200 femtoseconds) or less. The semiconductor laser element is configured from the mode synchronization semiconductor laser element of the current injection type and the dispersion compensation optical system which the laser beam emitted from the mode synchronization semiconductor laser element is incident on and is emitted from is included, so that the light density of the laser beam emitted from the mode synchronization semiconductor laser element is defined and the value of the carrier density in the mode synchronization semiconductor laser element is defined. Therefore, the self-phase modulation is generated in the high light power density and the high carrier density and the appropriate group velocity dispersion is applied thereto, thereby surely generating the light pulse in the sub-picosecond band. Alternatively, because a relation of the group velocity dispersion value of the dispersion compensation optical system and the pulse time width of the laser beam output from the mode synchronization semiconductor laser element to the outside (the outside of the system) is defined, the stabilized light pulse in the sub-picosecond band can be surely generated and reduction of noise in the generated light pulse can be realized. In addition to narrowing the light pulse time width of the light pulse in the sub-picosecond band, the mode synchronization semiconductor laser element is of the current injection type. For this reason, energy efficiency is high as compared with a semiconductor laser element of a light excitation type operated on the basis of the mode synchronization.

In the semiconductor laser device assembly of the second configuration including the dispersion compensation optical system, if a group velocity dispersion minimum value of the dispersion compensation optical system when the pulse time width of the laser beam output to the outside becomes a minimum value PW$_{min}$ is set to GVD$_{min}$, the pulse time width of the laser beam when the group velocity dispersion value of the dispersion compensation optical system is a negative first predetermined value GVD$_1$ is set to PW$_1$, and the light pulse width of the laser beam when the group velocity dispersion value of the dispersion compensation optical system is a negative second predetermined value GVD$_2$ is set to PW$_2$, (PW$_1$−PW$_{min}$)/|GVD$_{min}$−GVD$_1$|≥2× (PW$_2$−PW$_{min}$)/|GVD$_2$−GVD$_{min}$| (however, |GVD$_1$/ GVD$_{min}$|=0.5 and |GVD$_2$/GVD$_{min}$|=2) is preferably satisfied.

In the semiconductor laser device assembly of the second configuration including the dispersion compensation optical system including the preferred form, an operation is preferably executed at the group velocity dispersion minimum value GVD$_{min}$ at which the pulse time width of the laser beam output to the outside becomes the minimum value PW$_{min}$ or a value similar thereto. As described below, the group velocity dispersion value decreases (an absolute value of the group velocity dispersion value increases) and the number of subpulses other than a main pulse of time zero decreases. However, if an upper limit value of the group velocity dispersion value when the subpulse is not observed is set to GVD$_s$, the "value similar to the group velocity dispersion minimum value GVD$_{min}$" is defined by GVD$_s$±|GVD$_{min}$−GVD$_s$|.

In addition, in the semiconductor laser device assembly of the second configuration including the dispersion compensation optical system including the preferred form described above, a noise component with respect to a main oscillation frequency of the laser beam output to the outside is −60 dB or less, preferably −70 dB or less.

In the semiconductor laser device assembly of the first configuration or the second configuration including the dispersion compensation optical system, the mode synchronization semiconductor laser element can have a saturable absorption region as described below. In the semiconductor laser element of the light excitation type operated on the basis of the mode synchronization according to the related art, a temperature characteristic of a semiconductor saturable absorber (SESAME) is used to control an oscillation characteristic. However, in the form having the saturable absorption region, because the oscillation characteristic can be controlled on the basis of a reverse bias voltage applied to the saturable absorption region and the group velocity dispersion value of the dispersion compensation optical system, control of the oscillation characteristic is easy. The group velocity dispersion value in the dispersion compensation optical system is preferably negative. However, the group velocity dispersion value can be determined on the basis of the configuration and the structure of the mode synchronization semiconductor laser element and the configuration, the structure, and the driving method of the semiconductor laser device assembly (e.g., an amount of current applied to a carrier injection region (gain region), a reverse bias voltage applied to a saturable absorption region (carrier non-injection region), and a driving temperature) and can take a positive value, depending on the configuration and the structure of the mode synchronization semiconductor laser element and the configuration, the structure, and the driving method of the semiconductor laser device assembly.

In addition, in the semiconductor laser device assembly of the first configuration including the dispersion compensation optical system including the preferred configuration described above, an operation is preferably executed at a group velocity dispersion value at which the pulse time width of the laser beam output to the outside becomes a minimum value or a value similar thereto. The "value similar to the group velocity dispersion value" is a synonym for a value similar to the group velocity dispersion minimum value $GVD_{min}$ described above.

In the semiconductor laser device assembly of the second configuration including the dispersion compensation optical system, the light density of the laser beam emitted from the mode synchronization semiconductor laser element can be obtained by dividing power (the unit is watt and the power is peak power in the case of a pulse) of the laser beam by a sectional area (region where intensity becomes $1/e^2$ with respect to peak intensity) of a near-field image on an end face of the mode synchronization semiconductor laser element. In addition, the carrier density can be obtained by measuring a carrier lifetime and multiplying a value obtained by dividing a current injection amount by an area of an electrode (e.g., the first portion of the second electrode to be described below) of the gain unit with the carrier lifetime. In addition, the group velocity dispersion value can be obtained by a method of measuring a change of a pulse width observed after making a measured light pulse transmit a medium having a known dispersion amount or a frequency resolved optical gating (FROG). In addition, a time pulse width of about one picosecond or less can be measured using an SHG intensity correlation measuring device.

In addition, in the semiconductor laser device assembly of the first configuration or the second configuration including the dispersion compensation optical system including the preferred form and configuration described above, a wavelength selecting unit is included and the wavelength selecting unit can have a configuration in which a short wavelength component of a laser beam output to the outside is extracted.

When the semiconductor laser element is configured from a mode synchronization semiconductor laser element, the mode synchronization semiconductor laser element is configured from a mode synchronization semiconductor laser element of a bisection type in which a light emission region and a saturable absorption region are disposed in a resonator direction. The mode synchronization semiconductor laser element of the bisection type includes (a) a laminated structure formed by sequentially laminating a first compound semiconductor layer having a first conductive type and configured from a GaN compound semiconductor, a third compound semiconductor layer (active layer) configuring a light emission region and a saturable absorption region configured from the GaN compound semiconductor, and a second compound semiconductor layer having a second conductive type different from the first conductive type and configured from a GaN compound semiconductor, (b) a second electrode of a stripe shape that is formed on the second compound semiconductor layer, and (c) a first electrode that is electrically connected to the first compound semiconductor layer. The second electrode can be separated into a first portion to flow a direct current to the first electrode via the light emission region to enter a forward bias state and a second portion to apply a field to the saturable absorption region by a separation groove.

In addition, an electric resistance value between the first portion and the second portion of the second electrode is $1 \times 10$ times or more larger than an electric resistance value between the second electrode and the first electrode, preferably, $1 \times 10^2$ times or more larger than the electric resistance value, more preferably, $1 \times 10^3$ times or more larger than the electric resistance value. The mode synchronization semiconductor laser element is referred to as a "mode synchronization semiconductor laser element of a first configuration" for convenience. Alternatively, the electric resistance value between the first portion and the second portion of the second electrode is $1 \times 10^2 \Omega$ or more, preferably, $1 \times 10^3 \Omega$ or more, more preferably, $1 \times 10^4 \Omega$ or more. The mode synchronization semiconductor laser element is referred to as a "mode synchronization semiconductor laser element of a second configuration" for convenience.

In the mode synchronization semiconductor laser element of the first configuration or the second configuration, the direct current is flown from the first portion of the second electrode to the first electrode via the light emission region to enter a forward bias state and a voltage is applied between the first electrode and the second portion of the second electrode to apply a field to the saturable absorption region, thereby executing a passive mode synchronization operation.

In the mode synchronization semiconductor laser element of the first configuration or the second configuration, the electric resistance value between the first portion and the second portion of the second electrode is 10 times or more larger than an electric resistance value between the second electrode and the first electrode or $1 \times 10^2 \Omega$ or more, thereby surely suppressing a leakage current from flowing from the first portion of the second electrode to the second portion. That is, because a reverse bias voltage $V_{sa}$ applied to the saturable absorption region (carrier non-injection region) can be increased, the passive mode synchronization operation in which a light pulse has a short pulse time width can be realized. In addition, the high electric resistance value between the first portion and the second portion of the second electrode can be achieved by only separating the second electrode into the first portion and the second portion by the separation groove.

In addition, in the mode synchronization semiconductor laser element of the first configuration and the second configuration, although not limiting, a third compound semiconductor layer has a quantum well structure including a well layer and a barrier layer, a thickness of the well layer is 1 nm to 10 nm, preferably, 1 nm to 8 nm and an impurity doping concentration of the barrier layer is $2\times10^{18}$ cm$^{-3}$ to $1\times10^{20}$ cm$^{-3}$, preferably, $1\times10^{19}$ cm$^{-3}$ to $1\times10^{20}$ cm$^{-3}$. The mode synchronization semiconductor laser element may be referred to as a "mode synchronization semiconductor laser element of a third configuration" for convenience. By adopting the quantum well structure to the active layer, a high injection current amount can be realized as compared with the case of adopting a quantum dot structure and a high output can be easily obtained.

As such, the thickness of the well layer configuring the third compound semiconductor layer is defined as 1 nm to 10 nm and the impurity doping concentration of the barrier layer configuring the third compound semiconductor layer is defined as $2\times10^{18}$ cm$^{-3}$ to $1\times10^{20}$ cm$^{-3}$, that is, the thickness of the well layer is decreased and the carriers of the third compound semiconductor layer are increased, so that an influence of piezo polarization can be decreased and a laser light source to generate a single-peaked light pulse having a small pulse time width and a small subpulse component can be obtained. In addition, the passive mode synchronization operation can be achieved at a low reverse bias voltage and a light pulse train synchronized with an external signal (an electric signal and an optical signal) can be generated. Impurities doped into the barrier layer can be silicon (Si). However, the present disclosure is not limited thereto and the impurities can be oxygen (O).

Here, the mode synchronization semiconductor laser element can be a semiconductor laser element that has a separate confinement heterostructure (SCH structure) of a ridge stripe type. Alternatively, the mode synchronization semiconductor layer element can be a semiconductor laser element that has a separate confinement heterostructure of an oblique ridge stripe type. That is, an axis line of the mode synchronization semiconductor laser element and an axis line of the ridge stripe structure can cross at a predetermined angle. Here, $0.1°\leq\theta\leq10°$ can be exemplified as a predetermined angle $\theta$. The axis line of the ridge stripe structure is a straight line coupling a middle point of both ends of the ridge stripe structure in a light emission end face (for convenience, it may be referred to as a "second end face") and a middle point of both ends of the ridge stripe structure in an end face (for convenience, it may be referred to as a "first end face") of a laminated structure opposite to the light emission end face (second end face). In addition, the axis line of the mode synchronization semiconductor laser element shows an axis line orthogonal to the first end face and the second end face. A planar shape of the ridge stripe structure may be a linear shape or a curved shape.

Alternatively, in the mode synchronization semiconductor laser element, when a width of the ridge stripe structure in the second end face is set to $W_2$ and a width of the ridge stripe structure in the first end face is set to $W_1$, $W_1=W_2$ may be satisfied and $W_2>W_1$ may be satisfied. In addition, $W_2$ may be 5 μm or more and an upper limit value of $W_2$ may be, but not limited to, for example, $4\times10^2$ μm. In addition, $W_1$ may be 1.4 μm to 2.0 μm. Each end of the ridge stripe structure may be configured from one line segment and may be configured from two or more line segments. In the case of the former, a width of the ridge stripe structure can increase moderately in a tapered shape, monotonously, from the first end face to the second end face. Meanwhile, in the case of the latter, a width of the ridge stripe structure is first the same and then increases moderately in a tapered shape, monotonously, from the first end face to the second end face or the width of the ridge stripe structure first increases, is more than a maximum width, and decreases, from the first end face to the second end face.

In the mode synchronization semiconductor laser element, light reflectance of the second end face of the laminated structure from which the light beam (light pulse) is emitted is preferably 0.5% or less. Specifically, a low reflection coat layer can be formed on the second end face. Here, the low reflection coat layer is configured from a laminated structure of at least two kinds of layers selected from the group consisting of a titanium oxide layer, a tantalum oxide layer, a zirconia oxide layer, a silicon oxide layer, and an aluminum oxide layer. In addition, a value of the light reflectance is a value markedly lower than light reflectance (normally, 5% to 10%) of one end face of the laminated structure from which the light beam (light pulse) is emitted in the semiconductor laser element according to the related art. In addition, the first end face preferably has high light reflectance, for example, reflectance of 85% or more, preferably reflectance of 95% or more.

A value (X', unit: mm) of an external resonator length in an external resonator satisfies $0<X'<1500$, preferably, $30\leq X'\leq500$. Here, the external resonator is configured from the first end face of the mode synchronization semiconductor laser element and a reflection mirror or a partial reflection mirror configuring an external resonator structure and the external resonator length is a distance between the first end face of the mode synchronization semiconductor laser element and the reflection mirror or the partial reflection mirror configuring the external resonator structure.

In the mode synchronization semiconductor laser element, the laminated structure has the ridge stripe structure configured from a part of a thickness direction of at least the second compound semiconductor layer. However, the ridge stripe structure may be configured from only the second compound semiconductor layer, may be configured from the second compound semiconductor layer and the third compound semiconductor layer (active layer), and may be configured from the second compound semiconductor layer, the third compound semiconductor layer (active layer), and a part of the thickness direction of the first compound semiconductor layer.

In the mode synchronization semiconductor laser element of the first configuration or the second configuration, although not limiting, the width of the second electrode is 0.5 μm to 50 μm, preferably, 1 μm to 5 μm, the height of the ridge stripe structure is 0.1 μm to 10 μm, preferably, 0.2 μm to 1 μm, and the width of the separation groove to separate the second electrode into the first portion and the second portion is 1 μm or more and is not more than 50% of the resonator length in the mode synchronization semiconductor laser element (hereinafter, simply referred to as the "resonator length"), preferably, 10 μm or more and is not more than 10% of the resonator length. As the resonator length, 0.6 mm can be exemplified, but the present disclosure is not limited thereto. In addition, 2 μm or less can be exemplified as the width of the ridge stripe structure and 0.8 μm can be exemplified as a lower limit value of the width of the ridge stripe structure. However, the present disclosure is not limited thereto. A distance (D) from a top surface of a portion of the second compound semiconductor layer positioned to be closer to the outside than both lateral surfaces of the ridge stripe structure to the third compound semiconductor layer (active layer) is preferably $1.0 \times 10^{-7}$ m (0.1 μm) or more. By defining the distance (D) as described above, the saturable absorption region can be surely formed at both sides (Y direction) of the third compound semiconductor layer. An upper limit of the distance (D) may be determined on the basis of an increase in threshold current, a temperature characteristic, and a deterioration of a current increase rate at the time of long period driving.

In addition, in the mode synchronization semiconductor laser element of the first configuration or the second configuration including the preferred form, the second electrode can be configured from a single layer containing palladium (Pd), a single layer containing nickel (Ni), a single layer containing platinum (Pt), and a laminated structure of a palladium layer/platinum layer in which a palladium layer contacts the second compound semiconductor layer or a laminated structure of a palladium layer/nickel layer in which the palladium layer contacts the second compound semiconductor layer. When a lower layer metal layer is configured from palladium and an upper layer metal layer is configured from nickel, a thickness of the upper layer metal layer is set to 0.1 μm or more, preferably, 0.2 μm or more. Alternatively, the second electrode is preferably configured from the single layer containing the palladium (Pd). In this case, the thickness is set to 20 nm or more, preferably, 50 nm or more. Alternatively, the second electrode is preferably configured from the single layer containing the palladium (Pd), the single layer containing the nickel (Ni), the single layer containing the platinum (Pt), or the laminated structure of the lower layer metal layer and the upper layer metal layer in which the lower layer metal layer contacts the second compound semiconductor layer (however, the lower layer metal layer is configured from one kind of metal selected from a group consisting of the palladium, the nickel, and the platinum and the upper layer metal layer is configured from a metal in which an etching rate when the separation groove is formed in the second electrode in a process (D) to be described below is equal to, almost equal to, or higher than an etching rate of the lower layer metal layer). In addition, an etchant when the separation groove is formed in the second electrode in the process (D) to be described below is preferably aqua regia, nitric acid, sulfuric acid, hydrochloric acid, or a mixed liquid of at least two kinds of acids in the acids (specifically, a mixed liquid of the nitric acid and the sulfuric acid or a mixed liquid of the sulfuric acid and hydrochloric acid).

In the mode synchronization semiconductor laser element of the first configuration or the second configuration including the preferred configuration and form described above, the length of the saturable absorption region can be shorter than the length of the light emission region. Alternatively, the length of the second electrode (total length of the first portion and the second portion) can be shorter than the length of the third compound semiconductor layer (active layer). As an arrangement state of the first portion and the second portion of the second electrode, specifically, (1) a state in which a first portion of one second electrode and a second portion of one second electrode are provided and the first portion of the second electrode and the second portion of the second electrode are arranged with a separation groove therebetween, (2) a state in which a first portion of one second electrode and second portions of two second electrodes are provided, one end of the first portion faces one second portion with one separation groove therebetween, and the other end of the first portion faces the other second portion with the other separation groove therebetween, and (3) a state in which first portions of two second electrodes and a second portion of one second electrode are provided, an end of the second portion faces one first portion with one separation groove therebetween, and the other end of the second portion faces the other first portion with the other separation groove therebetween (i.e., a structure in which the second portion of the second electrode is interposed by the first portions) may be exemplified. In addition, (4) a state in which first portions of N second electrodes and second portions of (N−1) second electrodes are provided and the first portions of the second electrodes are arranged with the second portions of the second electrodes therebetween and (5) a state in which second portions of N second electrodes and first portions of (N−1) second electrodes are provided and the second portions of the second electrodes are arranged with the first portions of the second electrodes therebetween may be exemplified. That is, the states of (4) and (5) are (4') a state in which N light emission regions (carrier injection regions and gain regions) and (N−1) saturable absorption regions [carrier non-injection regions] are provided and the light emission regions are arranged with the saturable absorption regions therebetween and (5') a state in which N saturable absorption regions [carrier non-injection regions] and (N−1) light emission regions (carrier injection regions and gain regions) are provided and the saturable absorption regions are arranged with the light emission regions therebetween. By adopting the structures of (3), (5), and (5'), the light emission end face of the mode synchronization semiconductor laser element is rarely damaged.

The mode synchronization semiconductor laser element can be manufactured by the following method, for example. That is, the mode synchronization semiconductor laser element can be manufactured on the basis of a manufacturing method including (A) a process for forming a laminated structure formed by sequentially laminating a first compound semiconductor layer having a first conductive type and configured from a GaN compound semiconductor, a third compound semiconductor layer configuring a light emission region and a saturable absorption region configured from the GaN compound semiconductor, and a second compound semiconductor layer having a second conductive type different from the first conductive type and configured from the GaN compound semiconductor, on a base, (B) a process for forming a second electrode of a stripe shape on the second compound semiconductor layer, (C) a process for etching a part of at least the second compound semiconductor layer using the second electrode as a mask for etching and forming a ridge stripe structure, and (D) a process for forming a resist layer to form a separation groove in the second electrode and forming the separation groove in the second electrode by a wet etching method, using the resist layer as a mask for wet etching, thereby separating the second electrode into a first portion and a second portion by the separation groove.

In addition, because the manufacturing method is adopted, that is, the second electrode of the stripe shape is used as the mask for the etching and a part of at least the second compound semiconductor layer is etched to form the ridge stripe structure, that is, the ridge stripe structure is formed by a self-alignment method using the patterned second electrode as the mask for the etching, misalignment does not occur between the second electrode and the ridge stripe structure. In addition, the separation groove is formed in the second electrode by the wet etching method. As such, different from a dry etching method, the wet etching method is adopted, so that optical and electrical characteristics can be suppressed from being deteriorated in the second compound semiconductor layer. For this reason, a light emission characteristic can be surely prevented from being deteriorated.

In the process (C), the second compound semiconductor layer may be partially etched in a thickness direction, the second compound semiconductor layer may be completely etched in the thickness direction, the second compound semiconductor layer and the third compound semiconductor layer may be etched in the thickness direction, and the second compound semiconductor layer, the third compound semiconductor layer, and the first compound semiconductor layer may be partially etched in the thickness direction.

In addition, in the process (D), if an etching rate of the second electrode when the separation groove is formed in the second electrode is set to $ER_0$ and an etching rate of the laminated structure is set to $ER_1$, $ER_0/ER_1 \geq 1 \times 10$, preferably, $ER_0/ER_1 \geq 1 \times 10^2$ is satisfied. $ER_0/ER_1$ satisfies the above relation, so that the second electrode can be surely etched without etching the laminated structure (or even though the laminated structure is slightly etched).

In the semiconductor laser element, specifically, the laminated structure can be configured from an AlGaInN compound semiconductor. More specifically, GaN, AlGaN, GaInN, and AlGaInN can be exemplified as the AlGaInN compound semiconductor. In addition, a boron (B) atom, a thallium (Tl) atom, an arsenic (As) atom, a phosphorus (P) atom, and an antimonial (Sb) atom may be contained in the compound semiconductor, according to necessity. In addition, the third compound semiconductor layer (active layer) configuring the light emission region (gain region) and the saturable absorption region preferably has a quantum well structure. Specifically, the third compound semiconductor layer may have a single quantum well structure (QW structure) and may have a multiple quantum well structure (MQW structure). The third compound semiconductor layer (active layer) having the quantum well structure has a structure in which the well layer and the barrier layer of at least one layer are laminated. However, $(In_yGa_{(1-y)}N, GaN)$, $(In_yGa_{(1-y)}N, In_zGa_{(1-z)}N)$ [however, y>z], and $(In_yGa_{(1-y)}N, AlGaN)$ may be exemplified as a combination of (the compound semiconductor configuring the well layer and the compound semiconductor configuring the barrier layer).

In addition, in the semiconductor laser element, the second compound semiconductor layer has a super lattice structure in which the p-type GaN layer and the p-type AlGaN layer are alternately laminated and the thickness of the super lattice structure can be 0.7 μm or less. By adopting the super lattice structure, a series resistance component of the mode synchronization semiconductor laser element can be decreased while a refractive index necessary as a cladding layer is maintained, which results in leading to a low operation voltage of the mode synchronization semiconductor laser element. As a lower limit value of the thickness of the super lattice structure, although not limiting, 0.3 μm can be exemplified, 1 nm to 5 nm can be exemplified as the thickness of the p-type GaN layer configuring the super lattice structure, 1 nm to 5 nm can be exemplified as the thickness of the p-type AlGaN layer configuring the super lattice structure, and 60 layers to 300 layers can be exemplified as a total layer number of the p-type GaN layer and the p-type AlGaN layer. In addition, a distance from the third compound semiconductor layer to the second electrode can be 1 μm or less, preferably, 0.6 μm or less. As such, the distance from the third compound semiconductor layer to the second electrode is defined, so that the thickness of the p-type second compound semiconductor layer having high resistance can be decreased and reduction of an operation voltage of the mode synchronization semiconductor laser element can be achieved. In addition, as a lower limit value of the distance from the third compound semiconductor layer to the second electrode, although not limiting, 0.3 μm can be exemplified. In addition, Mg of $1 \times 10^{19}$ cm$^{-3}$ or more is doped into the second compound semiconductor layer and an absorption coefficient of the second compound semiconductor layer with respect to light having a wavelength of 405 nm from the third compound semiconductor layer can be at least 50 cm$^{-1}$. An atom concentration of Mg is derived from a material property in which a maximum hole concentration is shown when the atom concentration of Mg is at a value of $2 \times 10^{19}$ cm$^{-3}$ and the maximum hole concentration, that is, specific resistance of the second compound semiconductor layer is designed to be minimized. The absorption coefficient of the second compound semiconductor layer is defined from the viewpoint of minimizing resistance of the mode synchronization semiconductor laser element. As a result, an absorption coefficient of light of the third compound semiconductor layer is generally 50 cm$^{-1}$. However, an Mg doping amount can be intentionally set to a concentration of $2 \times 10^{19}$ cm$^{-3}$ or more to increase the absorption coefficient. In this case, an Mg doping amount of an upper limit in which a practical hole concentration can be obtained is, for example, $8 \times 10^{19}$ cm$^{-3}$. In addition, the second compound semiconductor layer has a non-doping compound semiconductor layer and a p-type compound semiconductor layer from the side of the third compound semiconductor layer and a distance from the third compound semiconductor layer to the p-type compound semiconductor layer can be $1.2 \times 10^{-7}$ m or less. As such, the distance from the third compound semiconductor layer to the p-type compound semiconductor layer is defined, so that internal loss can be suppressed in a range in which internal quantum coefficient is not lowered. Thereby, a threshold current density in which a laser oscillation starts can be decreased. In addition, as a lower limit value of the distance from the third compound semiconductor layer to the p-type compound semiconductor layer, although not limiting, $5 \times 10^{-8}$ m can be exemplified. In addition, a laminated insulating film configured from a $SiO_2/Si$ laminated structure is formed on both lateral surfaces of the ridge stripe structure and a difference of an effective refractive index of the ridge stripe structure and an effective refractive index of the laminated insulating film can be $5 \times 10^{-3}$ to $1 \times 10^{-2}$. By using the laminated insulating film, a single fundamental lateral mode can be maintained in an operation of a high output more than 100 milliwatts. In addition, the second compound semiconductor layer can have a structure formed by laminating a non-doping GaInN layer (p-side light guide layer), an Mg doping AlGaN layer (electron barrier layer), a super lattice structure (super lattice cladding layer) of a GaN layer (Mg doping)/AlGaN layer, and an Mg doping GaN layer (p-side contact layer), from the side of the third compound semiconductor layer. A band gap of the compound semiconductor configuring the well layer in the third compound semiconductor layer is preferably 2.4 eV or more. In addition, a wavelength of a laser beam emitted from the third compound semiconductor layer (active layer) is 360 nm to 500 nm, preferably, 400 nm to 410 nm. Here, the various configurations described above may be appropriately combined.

In the mode synchronization semiconductor laser element, the various GaN compound semiconductor layers configuring the mode synchronization semiconductor laser element are sequentially formed on the substrate. Here, in addition to a sapphire substrate, a GaAs substrate, a GaN substrate, a SiC substrate, an alumina substrate, a ZnS substrate, a ZnO substrate, an AlN substrate, an LiMgO substrate, an LiGaO$_2$ substrate, an MgAl$_2$O$_4$ substrate, an InP substrate, an Si substrate, and a resultant obtained by forming a base layer or a buffer layer on a surface (principal surface) of these substrates can be exemplified as the substrate. When a GaN compound semiconductor layer is formed on the substrate, the GaN substrate is preferable because the GaN substrate has a small defect density. However, it is known that polarity/non-polarity/half polarity and a characteristic of the GaN substrate are changed by a growth surface. As a method of forming the various compound semiconductor layers (e.g., the GaN compound semiconductor layer) configuring the mode synchronization semiconductor laser element, an organic metal chemical vapor phase growth method (an MOCVD method and an MOVPE method), a molecular beam epitaxy method (MBE method), and a hydride vapor phase growth method in which halogen contributes to transportation or a reaction may be exemplified.

Here, trimethyl gallium (TMG) gas and triethyl gallium (TEG) gas can be exemplified as organic gallium source gas in the MOCVD method and ammonia gas and hydrazine gas can be exemplified as nitrogen source gas. In addition, when a GaN compound semiconductor layer having a conductive type of an n type is formed, silicon (Si) may be added as n-type impurities (n-type dopant) and when a GaN compound semiconductor layer having a conductive type of a p type is formed, magnesium (Mg) may be added as p-type impurities (p-type dopant). In addition, when aluminum (Al) or indium (In) is included as a constituent atom of the GaN compound semiconductor layer, trimethyl aluminum (TMA) gas may be used as an Al source and trimethyl indium (TMI) gas may be used as an In source. Besides, monosilane gas (SiH$_4$ gas) may be used as a Si source and cyclopentadienyl magnesium gas, methyl cyclopentadienyl magnesium, and biscyclopentadienyl magnesium (Cp$_2$Mg) may be used as an Mg source. In addition to Si, Ge, Se, Sn, C, Te, S, O, Pd, and Po can be exemplified as n-type impurities (n-type dopant). In addition to Mg, Zn, Cd, Be, Ca, Ba, C, Hg, and Sr can be used as p-type impurities (p-type dopant).

When the first conductive type is set to an n type, the first electrode electrically connected to the first compound semiconductor layer having the conductive type of the n type preferably has a single layer configuration or a multilayer configuration in which at least one kind of metal selected from the group consisting of gold (Au), silver (Ag), palladium (Pd), Al (aluminum), Ti (titanium), tungsten (W), Cu (copper), Zn (zinc), tin (Sn), and indium (In) is contained and Ti/Au, Ti/Al, and Ti/Pt/Au can be exemplified. The first electrode is electrically connected to the first compound semiconductor layer. However, the first electrode may be formed on the first compound semiconductor layer and the first electrode may be connected to the first compound semiconductor layer through a conductive material layer or a conductive substrate. A film of the first electrode or the second electrode can be formed by a PVD method such as a vacuum deposition method or a sputtering method.

A pad electrode may be provided on the first electrode or the second electrode to be electrically connected to an external electrode or circuit. The pad electrode preferably has a single layer configuration or a multilayer configuration in which at least one kind of metal selected from the group consisting of Ti (titanium), aluminum (Al), Pt (platinum), Au (gold), and nickel (Ni) is contained. Alternatively, the pad electrode can have a multilayer configuration exemplified by a multilayer configuration of Ti/Pt/Au and a multilayer configuration of Ti/Au.

In the mode synchronization semiconductor laser element of the first configuration or the second configuration, as described above, the configuration in which the reverse bias voltage is applied between the first electrode and the second electrode (i.e., a configuration in which the first electrode is a positive electrode and the second electrode is a negative electrode) is preferable. In addition, the pulse current or the pulse voltage synchronized with the pulse current or the pulse voltage applied to the first portion of the second electrode may be applied to the second portion of the second electrode and the direct-current bias may be applied to the second portion of the second electrode. In addition, the current can be flown from the second electrode to the first electrode via the light emission region and the external electric signal can be overlapped from the second electrode to the first electrode via the light emission region. Thereby, the laser beam pulse and the external electric signal can be synchronized with each other. Alternatively, the optical signal can be input from one end face of the laminated structure. Thereby, the laser light pulse and the optical signal can be synchronized with each other. In addition, in the second compound semiconductor layer, a non-doping compound semiconductor layer (e.g., a non-doping GaInN layer or a non-doping AlGaN layer) may be formed between the third compound semiconductor layer and the electron barrier layer. In addition, a non-doping GaInN layer functioning as a light guide layer may be formed between the third compound semiconductor layer and the non-doping compound semiconductor layer. A structure in which an uppermost layer of the second compound semiconductor layer is occupied by an MG doping GaN layer (p-side contact layer) can be taken.

The mode synchronization semiconductor laser element is not limited to the semiconductor laser element of the bisection type (two-electrode type). A semiconductor laser element of a multi-section type (multi-electrode type) and a semiconductor laser element of a SAL (Saturable Absorber Layer) type in which the light emission region and the saturable absorption region are arranged in a vertical direction and a WI (Weakly Index guide) type in which a saturable absorption region is provided along a ridge strip structure can be adopted.

The present disclosure can be applied to fields such as an optical disk system, a communication field, an optical information field, a photoelectron integrated circuit, an application field of a non-linear optical phenomenon, an optical switch, a laser measurement field, various analysis fields, an ultrafast spectroscopy field, a multiphoton excitation spectroscopy field, a mass analysis field, a microspectroscopy field using multiphoton absorption, quantum control of a chemical reaction, a nano 3D processing field, various processing fields to be applications of multiphoton absorption, a medical field, and a bio-imaging field.

First Example

Figure 2A:
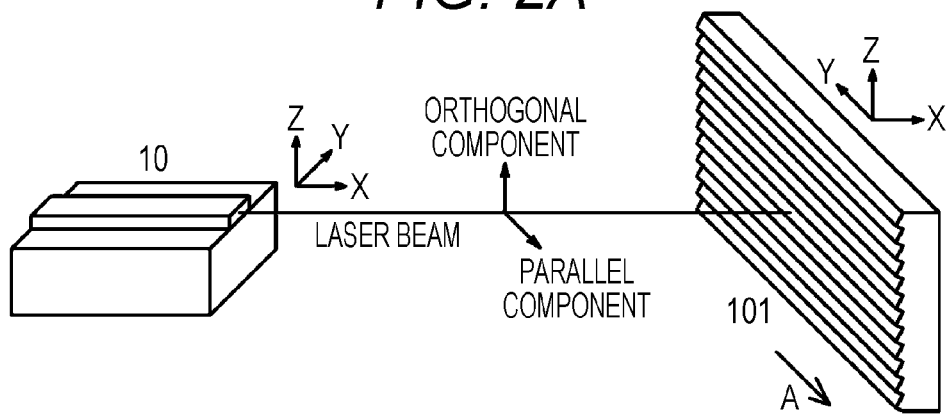
FIGS. 2A, 2B, and 2C are diagrams schematically illustrating an arrangement state of a semiconductor laser element and a diffraction grating or an optical element.
Figure 2B:
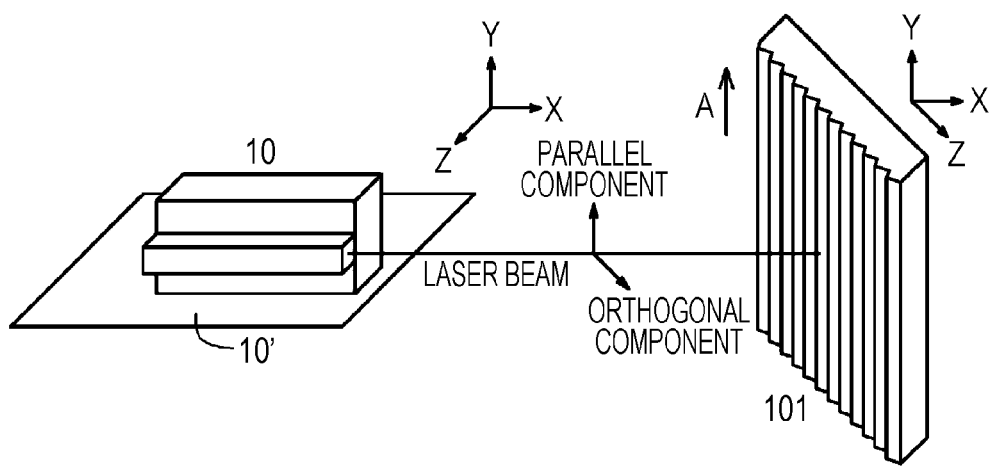
Figure 2C:
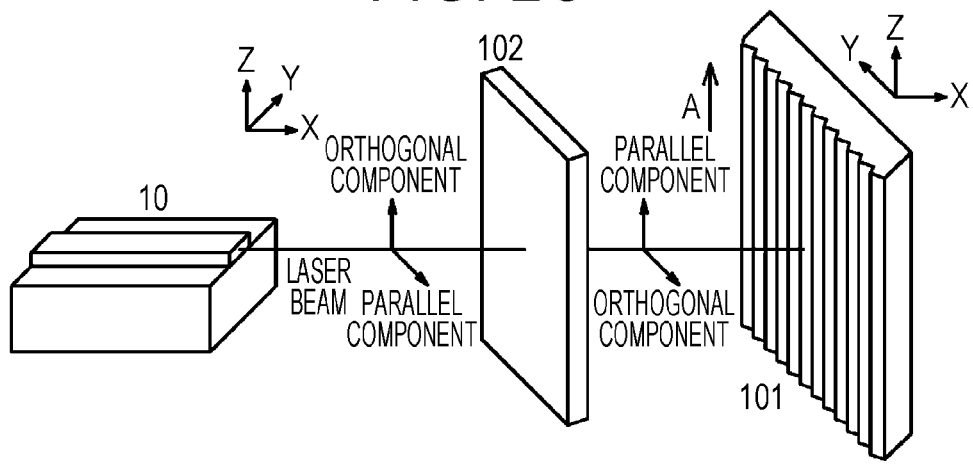
Figure 6:
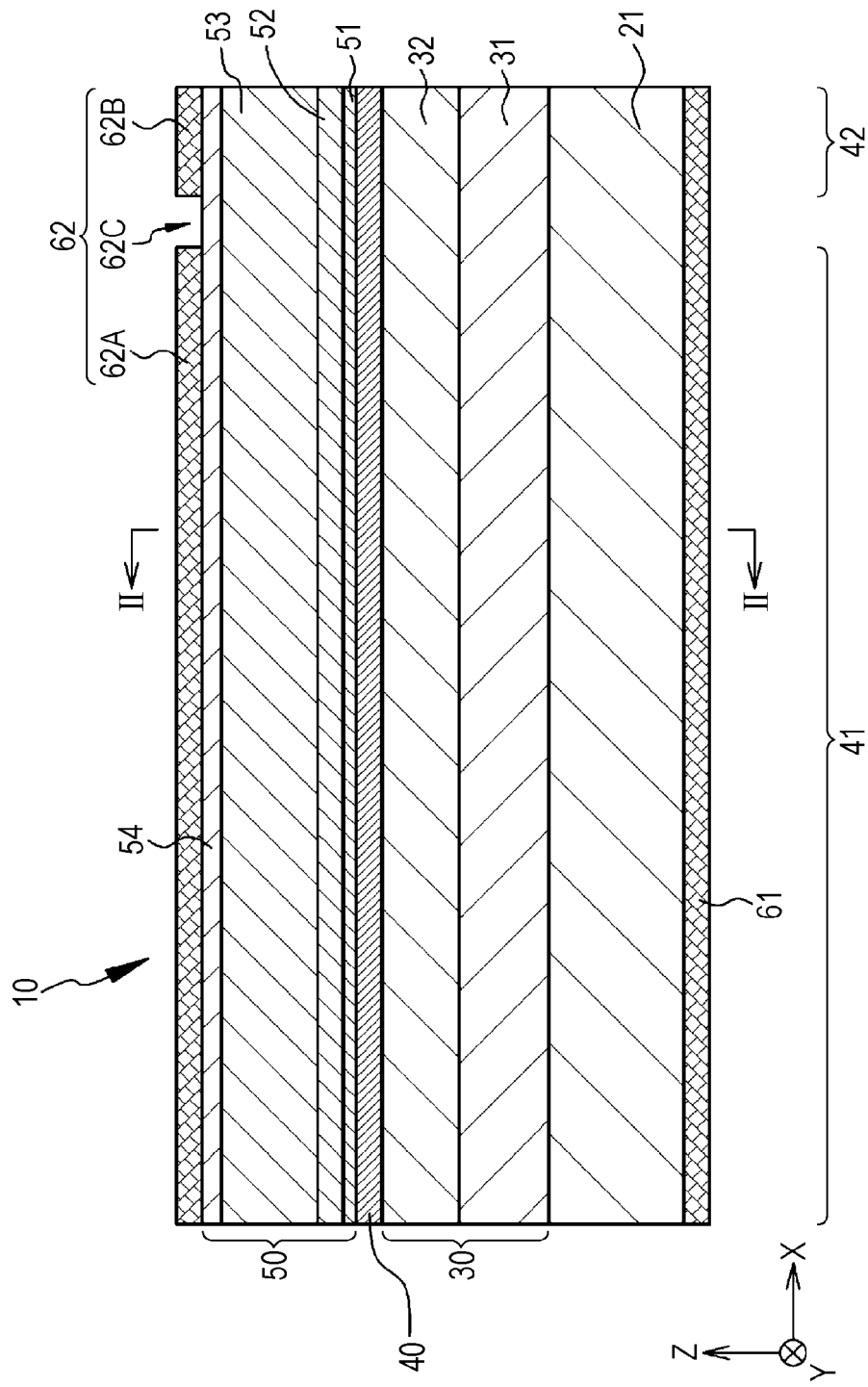
FIG. 6 is a schematic end view along an extension direction of a resonator of a semiconductor laser element in the first example.
Figure 7:
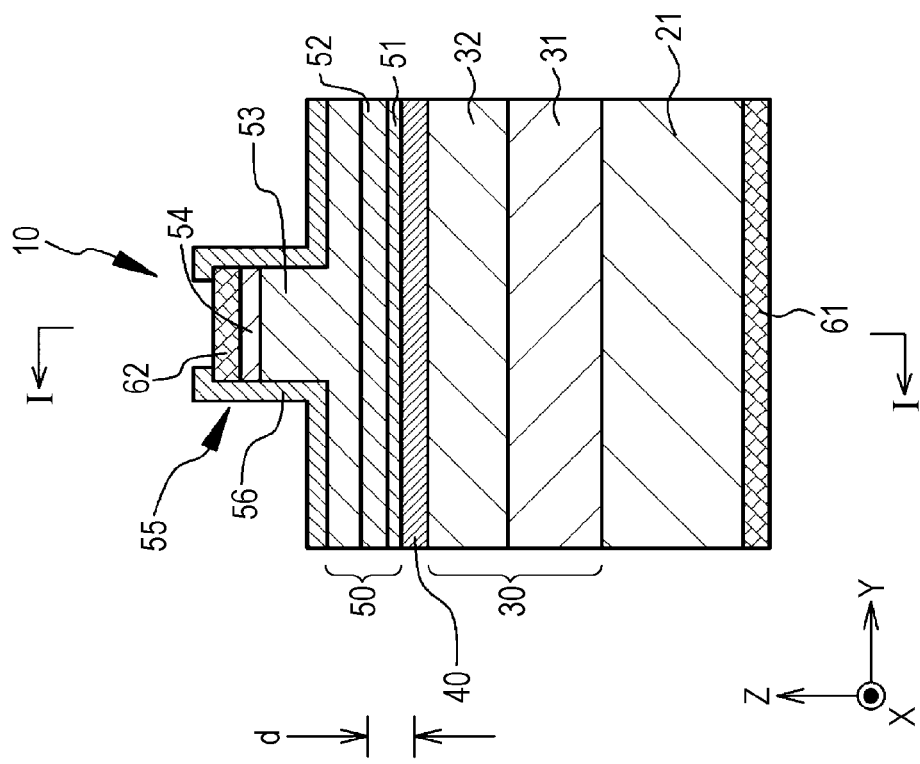
FIG. 7 is a schematic cross-sectional view taken along an extension direction and a right angle direction of the resonator of the semiconductor laser element in the first example.

A first example relates to a semiconductor laser device assembly according to the first aspect and the second aspect of the present disclosure. A conceptual diagram of the semiconductor laser device assembly according to the first example is illustrated in FIG. 1A, an arrangement state of a semiconductor laser element and a diffraction grating or an optical element is schematically illustrated in FIG. 2A, 2B, or 2C, a schematic cross-sectional view along an extension direction of a resonator of the semiconductor laser element is illustrated in FIG. 6, and a schematic cross-sectional view along a direction perpendicular to the extension direction of the resonator of the semiconductor laser element is illustrated in FIG. 7.

The semiconductor laser device assembly according to the first example or second to fourth examples to be described below includes (A) a semiconductor laser element and (B) a diffraction grating 101 that configures an external resonator, returns diffraction light other than zero-th order diffraction light to the semiconductor laser element, and outputs the zero-th order diffraction light to the outside. Alternatively, the semiconductor laser device assembly according to the first example or the second to fourth examples to be described below includes (A) a semiconductor laser element and (B) an optical element that configures an external resonator, returns a part of an incident laser beam to the semiconductor laser element, and outputs the remainder of the incident laser beam to the outside.

Here, the laser beam output to the outside passes through a plane mirror 201 and an optical isolator and is condensed to a multimode optical fiber by a condensing lens. However, a part of the laser beam is not illustrated in FIG. 1A.

In addition, in the first example or the second to fourth examples to be described below, specifically, the semiconductor laser element is driven to execute a passive mode synchronization operation. Hereinafter, the semiconductor laser element is referred to as a mode synchronization semiconductor laser element 10.

In the first example or the second to fourth examples to be described below, the mode synchronization semiconductor laser element 10 has a laminated structure formed by sequentially laminating a first compound semiconductor layer 30 configured from a GaN compound semiconductor and having a first conductive type, a third compound semiconductor layer (active layer) 40 configured from a GaN compound semiconductor, and a second compound semiconductor layer 50 configured from a GaN compound semiconductor and having a second conductive type different from the first conductive type.

More specifically, in the first example or the second to fourth examples to be described below, the mode synchronization semiconductor laser element 10 has a saturable absorption region. Specifically, the mode synchronization semiconductor laser element 10 is configured from a mode synchronization semiconductor laser element 10 of a bisection type in which a light emission region and a saturable absorption region are arranged in a resonator direction. Specifically, as illustrated in FIGS. 6 and 7, the mode synchronization semiconductor laser element 10 of the bisection type in a light emission wavelength band of 405 nm includes (a) a laminated structure formed by sequentially laminating a first compound semiconductor layer 30 having a first conductive type (in each example, specifically, a conductive type of an n type) and configured from a GaN compound semiconductor, a third compound semiconductor layer (active layer) 40 configuring a light emission region (gain region) 41 and a saturable absorption region 42 configured from a GaN compound semiconductor, and a second compound semiconductor layer 50 having a second conductive type (in each example, specifically, a conductive type of a p type) different from the first conductive type and configured from a GaN compound semiconductor, (b) a second electrode 62 of a stripe shape that is formed on the second compound semiconductor layer 50, and (c) a first electrode 61 that is electrically connected to the first compound semiconductor layer 30.

As illustrated in FIG. 1A, the external resonator is configured from the diffraction grating 101 (optical element). In addition, the diffraction grating 101 is configured from a diffraction grating of a reflection type and a blaze type and the diffraction grating 101 is arranged in a Littrow arrangement (also referred to as a Littman arrangement), in examples 1A, 1B, and 1C to be described below. Alternatively, the diffraction grating 101 is configured from a diffraction grating of a reflection type and a ruling type, in examples 1D, 1E, and 1F to be described below. Alternatively, the diffraction grating 101 is configured from a diffraction grating of a reflection type and a blaze type and the diffraction grating is arranged in a Littrow arrangement, in comparative examples 1A, 1B, 1C, $1G_1$, $1G_2$, $1H_1$, and $1H_2$ to be described below. Meanwhile, the diffraction grating 101 is configured from a diffraction grating of a reflection type and a ruling type, in comparative examples 1D, 1E, and 1F to be described below.

Figure 16A:
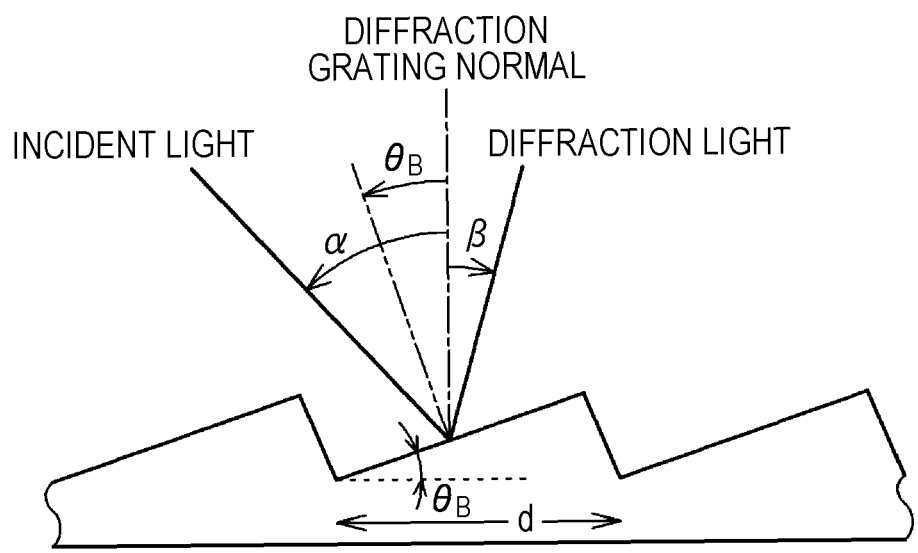
FIGS. 16A and 16B are schematic partial cross-sectional views of a diffraction grating.

Meanwhile, as illustrated in FIG. 16A, light having a wavelength λ is incident on a diffraction grating of a reflection type at an angle α and is diffracted at an angle β. Here, the angles α and β are angles from a normal of the diffraction grating and a counterclockwise direction is defined as a positive direction. In this case, a grating equation is as follows. Here, $N_0$ shows the number of grooves (a reciprocal number of a diffraction grating cycle. It is also referred to as a ruling number) per diffraction grating of 1 mm and n shows diffraction order (n=0, ±1, ±2 . . . ).

$$\sin(\alpha)+\sin(\beta)=N_0 \cdot n \cdot \lambda$$

Figure 16B:
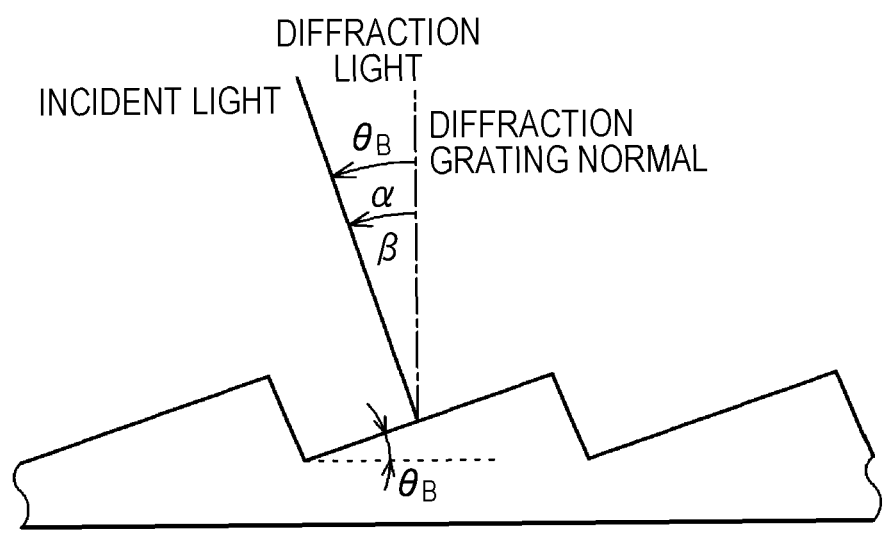

When incident light and n-th order diffraction light are in a relation of specular reflection with respect to an oblique surface of the groove, almost entire energy is concentrated on the n-th order diffraction light. If an inclination of the groove at this time is referred to as a blaze angle and is represented by $\theta_B$, $\theta_B=(\alpha+\beta)/2$ is satisfied. In addition, if a wavelength at this time is referred to as a blaze wavelength and is represented by $\lambda_B$, $\lambda_B=\{2/(N_0 \cdot n)\} \sin(\theta_B) \cdot \cos(\alpha-\theta_B)$ is satisfied. Here, as illustrated in FIG. 16B, if a wavelength when +n-th order diffraction light returns in a direction of incident light is represented by $\lambda_n$, at this time, $\alpha=\beta=\theta_B$ is satisfied. Finally, $$\lambda_n=2/(N_0 \cdot n)\sin(\theta_B) \quad (A)$$

is satisfied. An arrangement at this time is referred to as a Littrow arrangement.

Therefore, in the first example, n=1 and $\lambda_n=\lambda_B$ are set from the blaze wavelength $\lambda_B$, $\theta_B$ is calculated from the expression (A), the diffraction grating 101 is arranged such that an incidence angle of the laser beam becomes the blaze angle $\theta_B$, and light intensity is measured.

In addition, in the case in which the diffraction grating 101 is configured form a diffraction grating of a reflection type and a ruling type, when an incidence angle of a laser beam (wavelength: λ nm), which is emitted from the semiconductor laser element and is incident on the diffraction grating 101, on the diffraction grating 101 is set to $\Phi_{in}$, an emission angle is set to $\Phi_{out}$, a reciprocal number of a diffraction grating cycle of the diffraction grating 101 is set to $N_0$ (unit: $mm^{-1}$), and order of diffraction light is set to n, a relation of the following expression (0) is satisfied, n-th order diffraction light in the laser beam having collided with the diffraction grating 101 returns to the semiconductor laser element, and 0-th diffraction light is output to the outside.

More specifically, in the case in which only plus first order diffraction light is extracted, when a sign of angle of a clockwise direction with respect to a normal of the diffraction grating 101 is positive and a laser beam is incident at a positive angle, an emission angle $\Phi_{out}$ of minus first order diffraction light may be −90° or less, an emission angle $\Phi_{out}$ of plus second order diffraction light may be 90° or more, and an emission angle $\Phi_{out}$ of the plus first order diffraction light may be more than −90° and less than +90°. Therefore, the reciprocal number $N_0$ of the diffraction grating cycle, the wavelength λ, and the incidence angle $\Phi_{in}$ satisfying relations of the following expressions (1), (2), and (3) may be selected. Here, the expression (1) is an expression regarding the emission angle $\Phi_{out}$ of the plus first order diffraction light (n=+1), the expression (2) is an expression regarding the emission angle $\Phi_{out}$ of the minus first order diffraction light (n=−1), and the expression (3) is an expression regarding the emission angle $\Phi_{out}$ of the plus second order diffraction light (n=+2).

$$\Phi_{out}=\sin^{-1}[N_0 \cdot n \cdot \lambda - \sin(\Phi_{in})] \quad (0)$$

$$-90 < \Phi_{out}=\sin^{-1}[N_0 \cdot (+1) \cdot \lambda - \sin(\Phi_{in})] < 90 \quad (1)$$

$$\Phi_{out}=\sin^{-1}[N_0 \cdot (-1) \cdot \lambda - \sin(\Phi_{in})] \leq -90 \quad (2)$$

$$\Phi_{out}=\sin^{-1}[N_0 \cdot (+2) \cdot \lambda - \sin(\Phi_{in})] \geq 90 \quad (3)$$

Alternatively, the laser beam emitted from the semiconductor laser element collides with the diffraction grating 101, diffraction light (e.g., first order diffraction light) other than zero-th order diffraction light in the laser beam having collided with the diffraction grating 101 returns to the semiconductor laser element, and the zero-th order diffraction light in the laser beam having collided with the diffraction grating 101 is output to the outside.

When an axial direction of the semiconductor laser element (mode synchronization semiconductor laser element 10) is set to an X direction, a thickness direction is set to a Z direction, and a width direction is set to a Y direction, a main vibration of a field of the laser beam emitted from the mode synchronization semiconductor laser element 10 configured from a GaN compound semiconductor is included in an XY plane. That is, a value (ratio) of (field parallel laser beam component/field parallel laser beam component+field orthogonal laser beam component) is almost "1". In FIGS. 2), 2B, and 2C, in the laser beam emitted from the mode synchronization semiconductor laser element 10, the field parallel laser beam component and the field orthogonal laser beam component are represented as a "parallel component" and an "orthogonal component", respectively.

In the first example or the second to fourth examples to be described below, the extension direction of the diffraction surface of the diffraction grating 101 and the main vibration direction of the field of the laser beam incident on the diffraction grating 101 are substantially parallel to each other. Alternatively, in the first example or the second to fourth examples to be described below, extraction efficiency of a laser beam component (field parallel laser beam component) having a field of which a vibration direction is included in a plane parallel to a principal surface of the semiconductor laser element to the outside is higher than extraction efficiency of a laser beam component (field orthogonal laser beam component] having a field of which a vibration direction is included in a plane orthogonal to the principal surface of the semiconductor laser element to the outside.

That is, as illustrated in FIG. 2A, if the extension direction of the diffraction surface of the diffraction grating 101 is shown by an arrow "A", the extension direction is substantially parallel to the main vibration direction (in FIG. 2A, it is shown by the "parallel component") of the field of the laser beam incident on the diffraction grating 101. In other words, when the extension direction of the diffraction surface of the diffraction grating 101 is projected on a plane equivalent to a YZ plane, the extension direction of the diffraction surface of the diffraction grating 101 is substantially parallel to the Y direction. In the first example, when an angle formed by the vibration direction of the field and the extension direction of the diffraction surface of the diffraction grating 101 is set to η, |η|<45°, preferably, |η|≤10° is satisfied. In the first example, η=0° is set. This is applicable to the following description. In addition, the configuration of the diffraction grating 101 can be applied to the diffraction gratings 101 according to the second to fourth examples to be described below.

Alternatively, as illustrated in FIG. 2B, the mode synchronization semiconductor laser element 10 is supported by a supporting member 10', the main vibration of the field of the laser beam emitted from the mode synchronization semiconductor laser element 10 is included in the XY plane, and a normal of a semiconductor laser element supporting surface of the supporting member 10' is parallel to the Y direction. When the extension direction of the diffraction surface of the diffraction grating 101 is projected on the plane equivalent to the YZ plane, the extension direction of the diffraction surface of the diffraction grating 101 is substantially parallel to the Y direction. In addition, the configuration of the diffraction grating 101 can be applied to the diffraction gratings 101 according to the second to fourth examples to be described below.

Alternatively, as illustrated in FIG. 2C, a half-wavelength plate (λ/2 wavelength plate) 102 that is arranged between the mode synchronization semiconductor laser element 10 and the diffraction grating 101 is further included and the main vibration direction of the field of the laser beam having passed through the half-wavelength plate 102 is included in the XZ plane. When the extension direction of the diffraction surface of the diffraction grating 101 is projected on the plane equivalent to the YZ plane, the extension direction of the diffraction surface of the diffraction grating 101 is substantially parallel to the Z direction. In addition, the configuration of the diffraction grating 101 can be applied to the diffraction gratings 101 according to the second to fourth examples to be described below. Meanwhile, a long axis of an elliptical mode field of the laser beam emitted from the semiconductor laser element 10 is substantially parallel to the Z direction and a short axis is substantially parallel to the Y direction. In addition, the laser beam passes through the half-wavelength plate 102 and collides with the diffraction grating 101. Here, even though the laser beam passes through the half-wavelength plate 102, a direction of the long axis of the elliptical mode filed of the laser beam colliding with the diffraction grating 101 does not change and is substantially parallel to the Z direction. Therefore, the long axis of the elliptical mode field of the laser beam is substantially parallel to the extension direction (refer to the arrow A) of the diffraction surface of the diffraction grating. The main vibration direction (in FIG. 2C, it is shown by the "parallel component") of the field of the laser beam colliding with the diffraction grating 101 is substantially parallel to the long axis of the elliptical mode field.

Figure 1B:
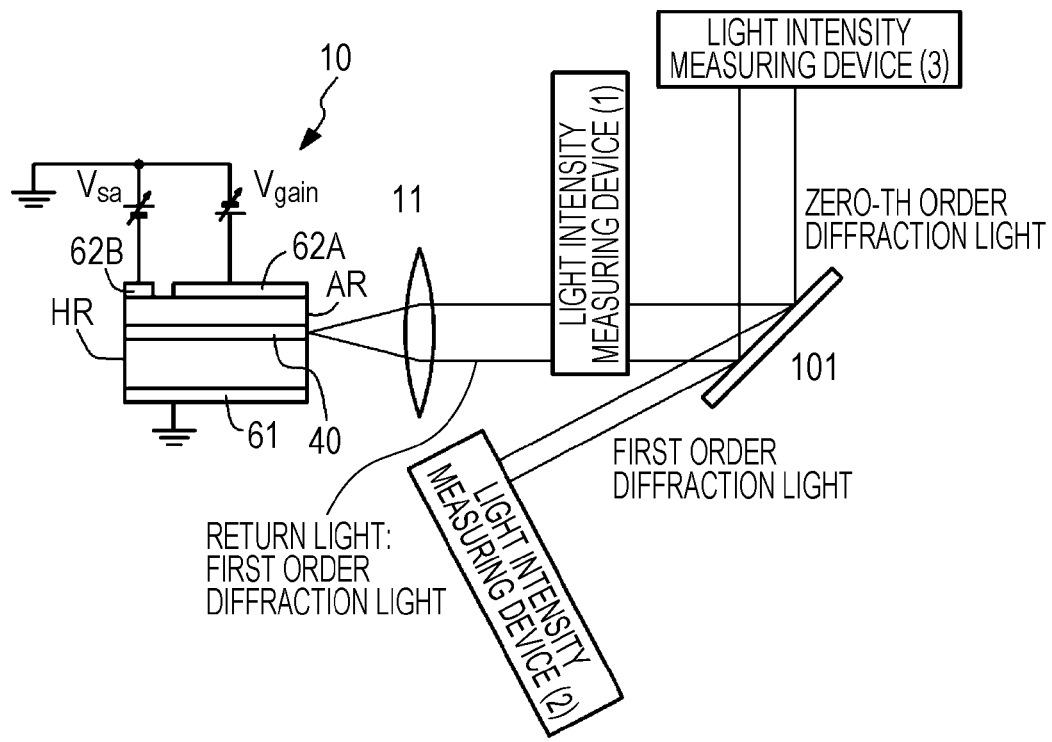

Extraction efficiency is measured using the diffraction grating 101 having reciprocal numbers (ruling number) $N_0$ of various diffraction grating cycles and blaze wavelengths $\lambda_B$, on the basis of the configuration illustrated in FIG. 2C. A result thereof is shown in the following Table 1. A peak wavelength ($\lambda$) of the laser beam emitted from the mode synchronization semiconductor laser element 10 is set to 403 nm. If the diffraction grating 101 is arranged in a Littrow arrangement, light intensity of the first order diffraction light cannot be measured. For this reason, in actuality, the diffraction grating 101 is arranged such that an arrangement is similar to the Littrow arrangement as much as possible and the light intensity of the first order diffraction light can be measured. An arrangement of various components in the semiconductor laser device assembly according to the first example to measure the light intensity is schematically illustrated in FIG. 1B. A light intensity measuring device (1) to measure the light intensity of the laser beam emitted from the mode synchronization semiconductor laser element 10 or returning to the mode synchronization semiconductor laser element 10, a light intensity measuring device (2) to measure the light intensity of the first order diffraction light diffracted by the diffraction grating 101, and a light intensity measuring device (3) to measure the light intensity of the 0-th diffraction light output to the outside by the diffraction grating 101 are arranged.

In addition, in Table 1, polarized light in which the extension direction of the diffraction surface of the diffraction grating and the vibration direction of the field are parallel to each other is represented as "parallel polarized light" and polarized light in which the extension direction of the diffraction surface of the diffraction grating and the vibration direction of the field are orthogonal to each other is represented as "orthogonal polarized light". However, the "parallel polarized light" corresponds to the examples and the "orthogonal polarized light" corresponds to the comparative examples. An average output $P_{out}$ of a laser beam immediately after passing through the half-wavelength plate 102 is acquired by the light intensity measuring device (1), an average output $P_1$ of the first order diffraction light is acquired by the light intensity measuring device (2), and an average output $P_0$ of the 0-th diffraction light is acquired by the light intensity measuring device (3). In addition, "extraction efficiency" (unit: %) is acquired from ($P_0/P_{out} \times 100$) and "resonator reflectance" (unit: %) is acquired from ($P_1/P_{out} \times 100$). In addition, "loss" (unit: %) is a value acquired from (100−resonator reflectance−extraction efficiency).

In Table 1, if the example 1A and the comparative example 1A, the example 1B and the comparative example 1B, the example 1C and the comparative example 1C, the example 1D and the comparative example 1D, the example 1E and the comparative example 1E, and the example 1F and the comparative example 1F are compared with each other, in all cases, extraction efficiency in the examples in which light is parallel polarized light is higher than extraction efficiency in the comparative examples in which light is orthogonal polarized light. In addition, in the examples, in the case in which the blaze wavelength $\lambda_B$ is set to the same value, if a value of a reciprocal number (ruling number) $N_0$ of a diffraction grating cycle is large, extraction efficiency is high. In addition, in the case in which the value of the reciprocal number (ruling number) $N_0$ of the diffraction grating cycle is the same, if a value of ($\lambda-\lambda_B$) is large, extraction efficiency is high. In the comparative examples $1G_1$, $1G_2$, $1H_1$, and $1H_2$, the value of ($\lambda-\lambda_B$) is a negative value and extraction efficiency in the case in which light is orthogonal polarized light is higher than extraction efficiency in the case in which light is parallel polarized light. However, a value of loss is excessively large and it is not practical. As described above, when extraction efficiency is increased to about 50%, a diffraction grating in which a value of a reciprocal number (ruling number) $N_0$ of a diffraction grating cycle is 1200 mm$^{-1}$ or more and a blaze wavelength $\lambda_B$ is equal to an oscillation wavelength or is shorter than the oscillation wavelength may be arranged such that parallel polarized light is obtained.

Figure 14A:
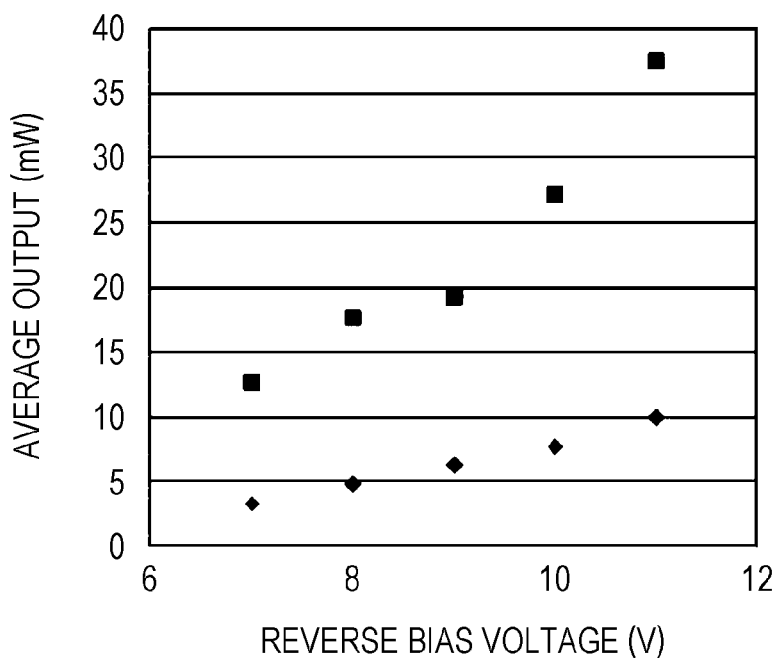
FIGS. 14A and 14B are graphs illustrating acquisition results of a relation of a reverse bias voltage and an average output and a relation of the reverse bias voltage and duration of a light pulse in the semiconductor laser device assembly according to the first example.
Figure 14B:
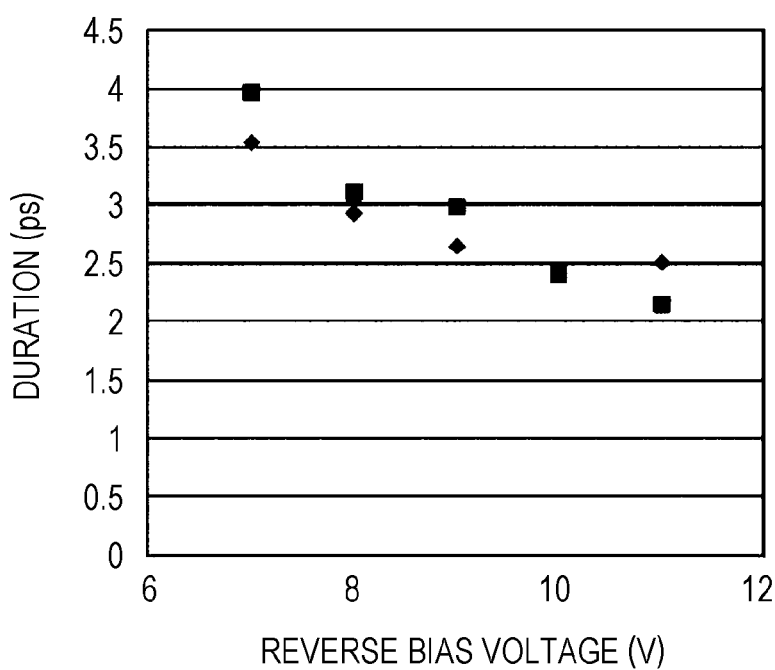

Acquisition results of a relation of a reverse bias voltage $V_{sa}$ applied to the saturable absorption region 42 and an average output and a relation of the reverse bias voltage $V_{sa}$ and duration of a light pulse in the semiconductor laser device assemblies according to the example 1A and the comparative example 1A are illustrated by graphs of FIGS. 14A and 14B. In FIGS. 14A and 14B, a square mark shows data of the example 1A and a lozenge mark shows data of the comparative example 1A. An average output in the example 1A in which light is parallel polarized light markedly increases as compared with the comparative example 1B in which light is orthogonal polarized light. However, a light pulse width is almost the same in the example 1A and the comparative example 1B.

Figure 3:
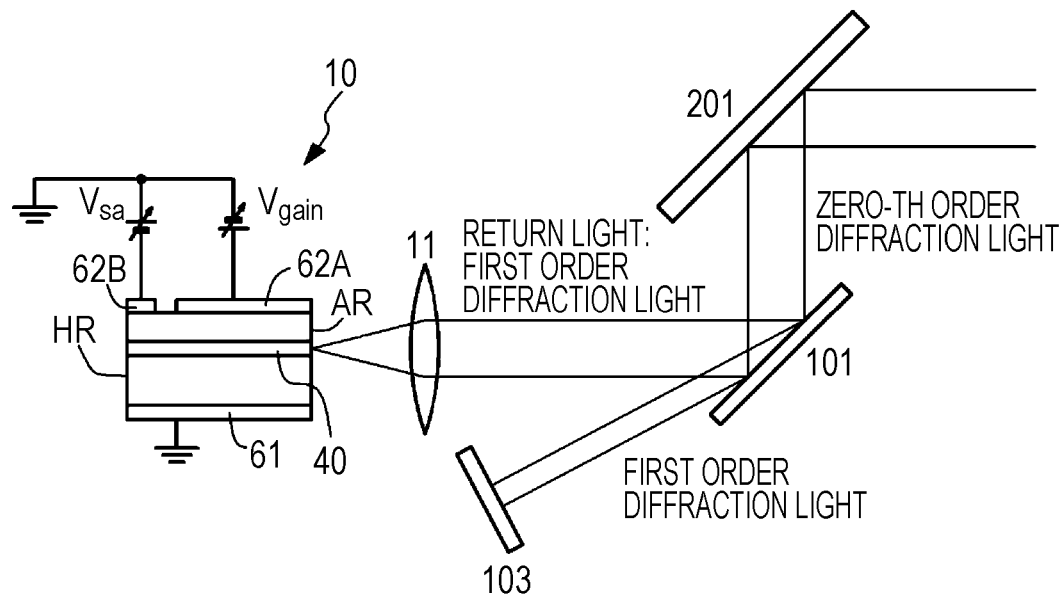
FIG. 3 is a conceptual diagram illustrating a modification of the semiconductor laser device assembly according to the first example.

In some cases, as illustrated in FIG. 3, an external resonator can adopt a configuration in which the external resonator is configured from a first end face of the mode

TABLE 1

| example | comparative example | $N_0$ mm$^{-1}$ | $\lambda_B$ nm | polarized light | extraction efficiency % | resonator reflectance % | loss % |
| --- | --- | --- | --- | --- | --- | --- | --- |
| 1A | | 3600 | 250 | parallel | 85.8 | 7.7 | 6.6 |
| | 1A | | | orthogonal | 31.5 | 53.2 | 15.3 |
| 1B | | 1200 | 250 | parallel | 46.9 | 28.4 | 24.7 |
| | 1B | | | orthogonal | 26.7 | 44.4 | 28.8 |
| 1C | | 600 | 250 | parallel | 29.9 | 41.5 | 28.6 |
| | 1C | | | orthogonal | 23.6 | 51.7 | 24.7 |
| 1D | | 2400 | 400 | parallel | 40.6 | 48.8 | 10.6 |
| | 1D | | | orthogonal | 3.5 | 77.1 | 19.4 |
| 1E | | 1800 | 400 | parallel | 17.1 | 60.8 | 22.1 |
| | 1E | | | orthogonal | 0.6 | 72.5 | 27.0 |
| 1F | | 1200 | 400 | parallel | 10.3 | 58.1 | 31.6 |
| | 1F | | | orthogonal | 1.4 | 75.2 | 23.4 |
| 1G1 | | 1800 | 500 | parallel | 27.3 | 61.5 | 11.1 |
| | 1G2 | | | orthogonal | 29.3 | 20.7 | 50.0 |
| 1H1 | | 1200 | 500 | parallel | 0.5 | 51.8 | 47.7 |
| | 1H2 | | | orthogonal | 14.7 | 33.3 | 52.1 | synchronization semiconductor laser element 10 and a reflection mirror 103 configuring an external resonator structure. Here, a laser beam emitted from the mode synchronization semiconductor laser element 10 collides with the diffraction grating 101 (optical element), first order diffraction light from the diffraction grating 101 (optical element) collides with the reflection mirror 103, is reflected, is incident on the diffraction grating 101 (optical element), and returns to the mode synchronization semiconductor laser element 10. Meanwhile, the zero-th order diffraction light in the laser beam having collided with the diffraction grating 101 is output to the outside.

Specifically, the mode synchronization semiconductor laser element 10 in the first example or the second to fourth examples to be described below is a semiconductor laser element that has a separate confinement heterostructure (SCH structure) of a ridge stripe type. More specifically, the mode synchronization semiconductor laser element 10 is a GaN semiconductor laser element configured from AlGaInN of an index guide type and has a ridge stripe structure. In addition, the first compound semiconductor layer 30, the third compound semiconductor layer 40, and the second compound semiconductor layer 50 are configured from an AlGaInN compound semiconductor, specifically, and have a layer configuration illustrated in the following Table 2, more specifically. Here, in Table 2, a compound semiconductor layer described at a lower side is a layer close to an n-type GaN substrate 21. A band gap of a compound semiconductor configuring a well layer in the third compound semiconductor layer 40 is 3.06 eV. The mode synchronization semiconductor laser element 10 in the first example or the second to fourth examples to be described below is provided on a (0001) plane of the n-type GaN substrate 21 and the third compound semiconductor layer 40 has a quantum well structure. The (0001) plane of the n-type GaN substrate 21 is also referred to as a "C plane" and is a crystal plane having polarity.

TABLE 2 second compound semiconductor layer 50
    p-type GaN contact layer (Mg doping) 54
    p-type GaN (Mg doping)/AlGaN super lattice cladding layer 53
    p-type AlGaN electron barrier layer (Mg doping) 52
    non-doping GaInN light guide layer 51
third compound semiconductor layer 40
    GaInN quantum well active layer
    (well layer: $Ga_{0.92}In_{0.08}N$/barrier layer: $Ga_{0.98}In_{0.02}N$)
first compound semiconductor layer 30
    n-type GaN cladding layer 32
    n-type AlGaN cladding layer 31
however,
    well layer (two layers)    8 mm non-doping
    barrier layer (three layers)    14 mm Si doping In addition, parts of the p-type GaN contact layer 54 and the p-type GaN/AlGaN super lattice cladding layer 53 are removed by an RIE method and a ridge stripe structure 55 is formed. A laminated insulating film 56 configured from $SiO_2$/Si is formed on both lateral surfaces of the ridge stripe structure 55. A $SiO_2$ layer is a lower layer and a Si layer is an upper layer. Here, a difference of an effective refractive index of the ridge stripe structure 55 and an effective refractive index of the laminated insulating film 56 is $5 \times 10^{-3}$ to $1 \times 10^{-2}$, specifically, $7 \times 10^{-3}$. In addition, a second electrode (p-side ohmic electrode) 62 is formed on the p-type GaN contact layer 54 corresponding to a top surface of the ridge stripe structure 55. Meanwhile, a first electrode (n-side ohmic electrode) 61 configured from Ti/Pt/Au is formed on a back surface of the n-type GaN substrate 21.

In the mode synchronization semiconductor laser element 10 in the first example or the second to fourth examples to be described below, the p-type AlGaN electron barrier layer 52, the p-type GaN/AlGaN super lattice cladding layer 53, and the p-type GaN contact layer 54 to be compound semiconductor layers in which Mg is doped to a light density distribution generated from the third compound semiconductor layer 40 and a surrounding portion thereof are made not to overlap each other as much as possible, so that internal loss is suppressed in a range in which internal quantum efficiency is not lowered. Thereby, a threshold current density in which a laser oscillation starts is decreased. Specifically, a distance d from the third compound semiconductor layer 40 to the p-type AlGaN electron barrier layer 52 is set to 0.10 μm, a height of the ridge stripe structure 55 is set to 0.30 μm, a thickness of the second compound semiconductor layer 50 positioned between the second electrode 62 and the third compound semiconductor layer 40 is set to 0.50 μm, and a thickness of a portion of the p-type GaN/AlGaN super lattice cladding layer 53 positioned at the lower side of the second electrode 62 is set to 0.40 μm. In addition, the ridge stripe structure 55 is curved toward a second end face to decrease end face reflection. However, the shape of the ridge stripe structure 55 is not limited to the above shape.

In addition, in the mode synchronization semiconductor laser element 10 in the first example or the second to fourth examples to be described below, the second electrode 62 is separated into a first portion 62A to make a direct current flow to the first electrode 61 via the light emission region (gain region) 41 to enter a forward bias state and a second portion 62B to apply a field to the saturable absorption region 42 (the second portion 62B to apply a reverse bias voltage $V_{sa}$ to the saturable absorption region 42) by the separation groove 62C. Here, an electric resistance value (it may be referred to as "a separation resistance value") between the first portion 62A and the second portion 62B of the second electrode 62 is 1×10 times or more larger than an electric resistance value between the second electrode 62 and the first electrode 61, specifically, $1.5 \times 10^3$ times larger than the electric resistance value. In addition, the electric resistance value (separation resistance value) between the first portion 62A and the second portion 62B of the second electrode 62 is $1 \times 10^2 \Omega$ or more, specifically, $1.5 \times 10^4 \Omega$. A length of a resonator of the mode synchronization semiconductor laser element 10 is set to 600 μm and lengths of the first portion 62A, the second portion 62B, and the separation groove 62C of the second electrode 62 are set to 560 μm, 30 μm, and 10 μm, respectively. In addition, a width of the ridge stripe structure 55 is set to 1.4 μm.

In addition, in the mode synchronization semiconductor laser element 10 in the first example or the second to fourth examples to be described below, a non-reflection coat layer (AR) is formed on a light emission end face (second end face) facing a collimating unit 11. Meanwhile, a high-reflection coat layer (HR) is formed on an end face (first end face) facing the light emission end face (second end face) in the mode synchronization semiconductor laser element 10. The saturable absorption region 42 is provided on a side of a first end face in the mode synchronization semiconductor laser element 10. A laminated structure of at least two kinds of layers selected from the group consisting of a titanium oxide layer, a tantalum oxide layer, a zirconia oxide layer, a silicon oxide layer, and an aluminum oxide layer can be exemplified as the non-reflection coat layer (low-reflection coat layer).

A pulse repetition frequency of the mode synchronization semiconductor laser element 10 in the first example or the second to fourth examples to be described below is set to 1 GHz. A repetition frequency f of a light pulse train is determined by a length X' of the external resonator (a distance between the first end face and the reflection mirror 113) and is represented by the following expression. Here, c shows a light speed and n shows an effective refractive index of the resonator.

$$f=c/(2n\cdot X')$$

However, the second electrode 62 having a separation resistance value of $1 \times 10^2 \Omega$ or more is preferably formed on the second compound semiconductor layer 50, as described above. In the case of the GaN semiconductor laser element, different from the GaAs semiconductor laser element according to the related art, mobility in a compound semiconductor having a conductive type of a p type is small. For this reason, the second electrode 62 formed on the second compound semiconductor layer 50 is separated by the separation groove 62C without increasing resistance of the second compound semiconductor layer 50 having the conductive type of the p type by ion injection, so that the electric resistance value between the first portion 62A and the second portion 62B of the second electrode 62 can be 10 times or more larger than an electric resistance value between the second electrode 62 and the first electrode 61 or the electric resistance value between the first portion 62A and the second portion 62B of the second electrode 62 can be $1 \times 10^2 \Omega$ or more.

Here, characteristics required for the second electrode 62 are as follows. That is, (1) the second electrode 62 has a function as a mask for etching when the second compound semiconductor layer 50 is etched, (2) the second electrode 62 enables wet etching without deteriorating optical and electrical characteristic of the second compound semiconductor layer 50, (3) the second electrode 62 shows a contact specific resistance value of $10^{-2}$ $\Omega \cdot cm^2$ or less, when a film is formed on the second compound semiconductor layer 50, (4) in the case of a laminated structure, a material configuring a lower layer metal layer has a large work function, shows a low contact specific resistance value with respect to the second compound semiconductor layer 50, and enables wet etching, and (5) in the case of a laminated structure, a material configuring an upper layer metal layer has resistance against etching when a ridge stripe structure is formed (e.g., $Cl_2$ gas used in an RIE method) and enables wet etching.

In the first example or the second to fourth examples to be described below, the second electrode 62 is configured from a Pd single layer having a thickness of 0.1 μm.

A thickness of the p-type GaN/AlGaN super lattice cladding layer 53 having the super lattice structure in which the p-type GaN layer and the p-type AlGaN layer are alternately laminated is 0.7 μm or less, specifically, 0.4 μm, a thickness of the p-type GaN layer configuring the super lattice structure is 2.5 nm, a thickness of the p-type AlGaN layer configuring the super lattice structure is 2.5 nm, and a total layer number of the p-type GaN layers and the p-type AlGaN layers is 160. In addition, a distance from the third compound semiconductor layer 40 to the second electrode 62 is 1 μm or less, specifically, 0.5 μm. In addition, Mg of $1 \times 10^{19}$ $cm^{-3}$ or more (specifically, $2 \times 10^{19}$ $cm^{-3}$) is doped into the p-type AlGaN electron barrier layer 52, the p-type GaN/AlGaN super lattice cladding layer 53, and the p-type GaN contact layer 54 configuring the second compound semiconductor layer 50 and an absorption coefficient of the second compound semiconductor layer 50 with respect to light having a wavelength of 405 nm is at least 50 $cm^{-1}$, specifically, 65 $cm^{-1}$. In addition, the second compound semiconductor layer 50 has a non-doping compound semiconductor layer (the non-doping GaInN light guide layer 51) and a p-type compound semiconductor layer from the side of the third compound semiconductor layer. However, a distance (d) from the third compound semiconductor layer 40 to the p-type compound semiconductor layer (specifically, the p-type AlGaN electron barrier layer 52) is $1.2 \times 10^{-7}$ m or less, specifically, 100 nm.

Hereinafter, a method of manufacturing the mode synchronization semiconductor laser element in the first example or the second to fourth examples to be described below will be described with reference to FIGS. 11A, 11B, 12A, 12B, and 13. FIGS. 11A, 11B, 12A, and 12B are schematic partial cross-sectional views when a substrate or the like is cut on the YZ plane and FIG. 13 is a schematic partial end view when the substrate or the like is cut on the XZ plane.

[Process 100]

Figure 11A:
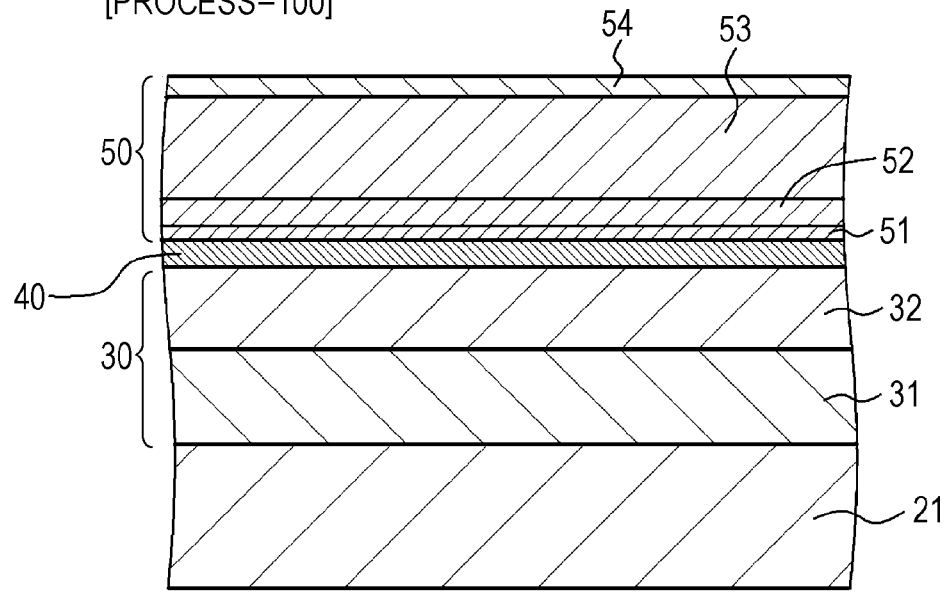
FIGS. 11A and 11B are schematic partial cross-sectional views of a substrate and the like to describe a method of manufacturing the mode synchronization semiconductor laser element according to the first example.
Figure 11B:
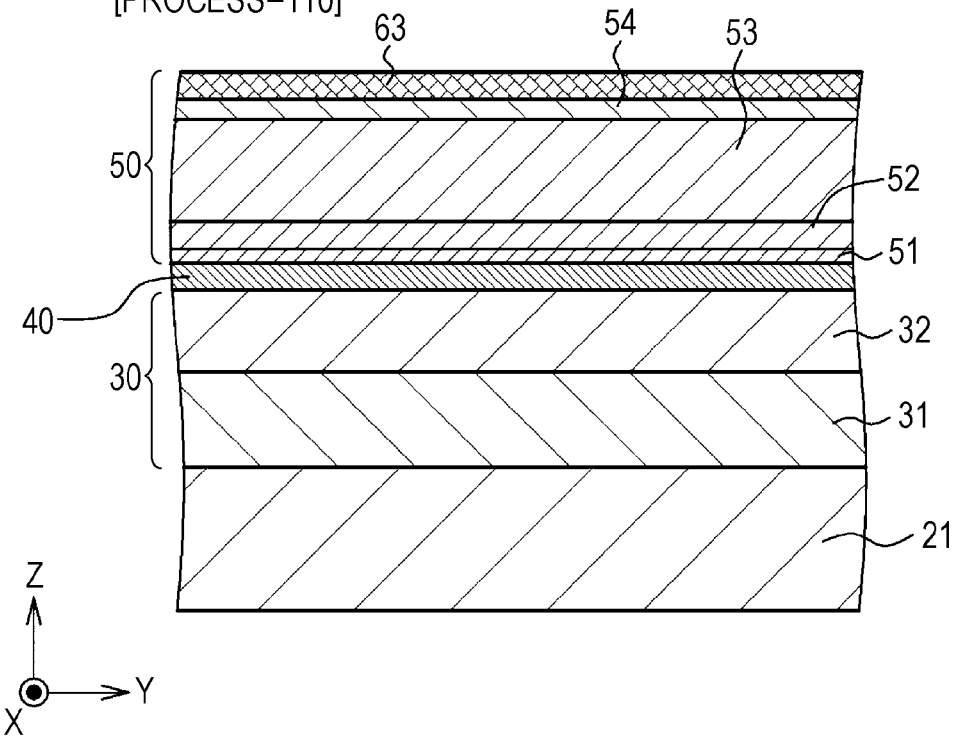
Figure 12A:
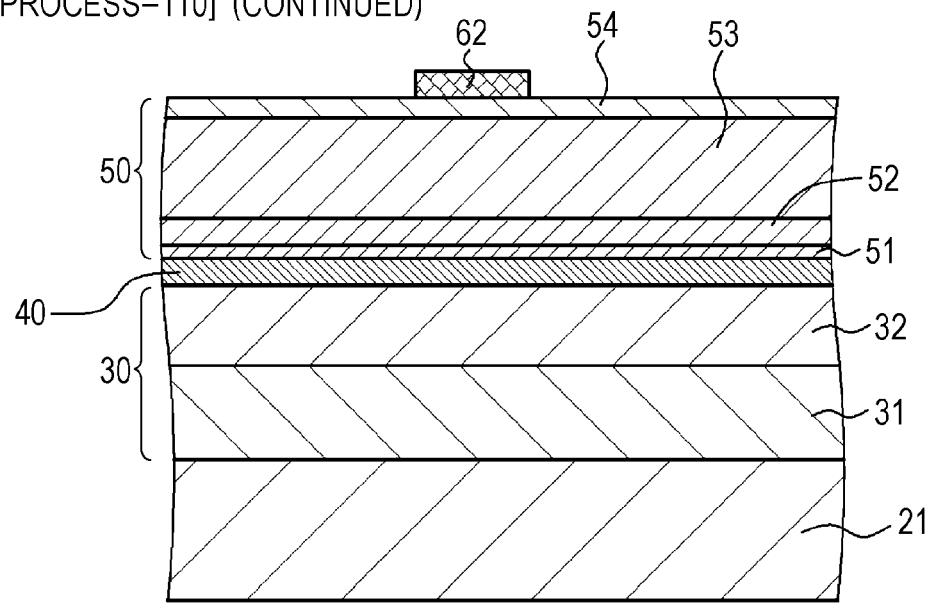
FIGS. 12A and 12B are schematic partial cross-sectional views of a substrate and the like to describe a method of manufacturing the mode synchronization semiconductor laser element according to the first example, subsequent to FIG. 11B.
Figure 12B:
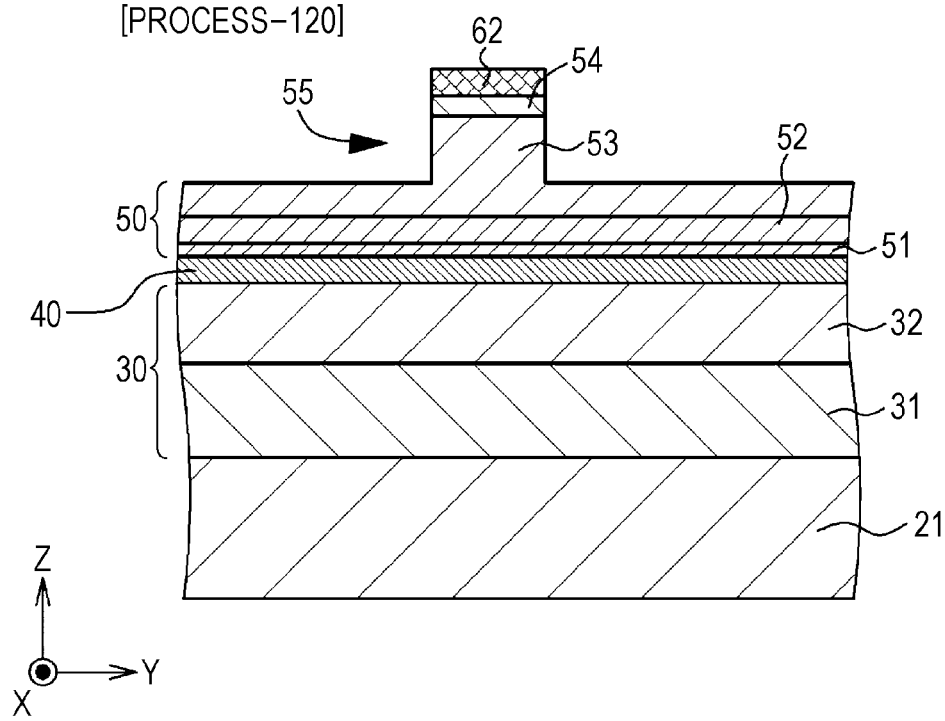

First, the laminated structure, which is formed by sequentially laminating the first compound semiconductor layer 30 having the first conductive type (the conductive type of the n type) and configured from the GaN compound semiconductor, the third compound semiconductor layer (active layer 40) configuring the light emission region (gain region) 41 and the saturable absorption region 42 configured from the GaN compound semiconductor, and the second compound semiconductor layer 50 having the second conductive type (the conductive type of the p type) different from the first conductive type and configured from the GaN compound semiconductor, is formed on the base, specifically, the (0001) plane of the n-type GaN substrate 21, on the basis of the known MOCVD method (refer to FIG. 11A).

[Process 110]

Then, the second electrode 62 of the stripe shape is formed on the second compound semiconductor layer 50. Specifically, after the Pd layer 63 is formed on an entire surface on the basis of a vacuum deposition method (refer to FIG. 11B), a resist layer having a stripe shape for etching is formed on the Pd layer 63, on the basis of a photolithography technique. In addition, after the Pd layer 63 not covered with the resist layer for the etching is removed using aqua regia, the resist layer for the etching is removed. In this way, a structure illustrated in FIG. 12A can be obtained. The second electrode 62 having the stripe shape may be formed on the second compound semiconductor layer 50, on the basis of a lift-off technique.

[Process 120]

Next, a part of at least the second compound semiconductor layer 50 is etched using the second electrode 62 as a mask for etching (specifically, the part of the second compound semiconductor layer 50 is etched) and a ridge stripe structure is formed. Specifically, the part of the second compound semiconductor layer 50 is etched using the second electrode 62 as a mask for etching, on the basis of an RIE method using $Cl_2$ gas. In this way, a structure illustrated in FIG. 12B can be obtained. As such, the ridge stripe structure is formed by self alignment using the second electrode 62 patterned in a stripe shape as the mask for the etching. Therefore, misalignment does not occur between the second electrode 62 and the ridge stripe structure.

[Process 130]

Then, the resist layer 64 to form the separation groove in the second electrode 62 is formed (refer to FIG. 13). A reference numeral 65 shows an opening portion provided in the resist layer 64 to form the separation groove. Next, the separation groove 62C is formed in the second electrode 62 by a wet etching method, using the resist layer 64 as a mask for wet etching, thereby separating the second electrode 62 into the first portion 62A and the second portion 62B by the separation groove 62C. Specifically, the entire second electrode 62 is immersed in the aqua regia for about 10 seconds, using the aqua regia as an etchant, so that the separation groove 62C is formed in the second electrode 62. Then, the resist layer 64 is removed. In this way, a structure illustrated in FIGS. 6 and 7 can be obtained. As such, different from a dry etching method, optical and electrical characteristics of the second compound semiconductor layer 50 are not deteriorated by adopting the wet etching method. For this reason, a light emission characteristic of the mode synchronization semiconductor laser element is not deteriorated. When the dry etching method is adopted, internal loss $\alpha_i$ of the second compound semiconductor layer 50 increases and a threshold voltage increases or a light output decreases. Here, when an etching rate of the second electrode 62 is set to $ER_0$ and an etching rate of the laminated structure is set to $ER_1$, $ER_0/ER_1 \approx 1 \times 10^2$ is satisfied. As such, because high etching selectivity exists between the second electrode 62 and the second compound semiconductor layer 50, the second electrode 62 can be surely etched without etching the laminated structure (or even though the laminated structure is slightly etched). In addition, $ER_0/ER_1 \geq 1 \times 10$, preferably, $ER_0/ER_1 \geq 1 \times 10^2$ is satisfied.

The second electrode may be configured from a laminated structure of a lower layer metal film configured from palladium (Pd) having the thickness of 20 nm and an upper layer metal film configured from nickel (Ni) having the thickness of 200 nm. Here, in the wet etching using the aqua regia, an etching rate of the nickel is about 1.25 times larger than an etching rate of the palladium.

[Process 140]

Then, an n-side electrode is formed and the substrate is cleaved. In addition, packaging is performed, so that the mode synchronization semiconductor layer element 10 can be manufactured.

As described above, in the semiconductor laser device assembly according to the first example, the extension direction of the diffraction surface of the diffraction grating and the main vibration direction of the field of the laser beam incident on the diffraction grating are substantially parallel to each other. Alternatively, the extraction efficiency of the laser beam component having the field of which the vibration direction is included in the plane parallel to the principal surface of the semiconductor laser element to the outside is higher than the extraction efficiency of the laser beam component having the field of which the vibration direction is included in the plane orthogonal to the principal surface of the semiconductor laser element to the outside. For this reason, an average output of the laser beam output from the semiconductor laser element to the outside can be increased.

Second Example

Figure 4:
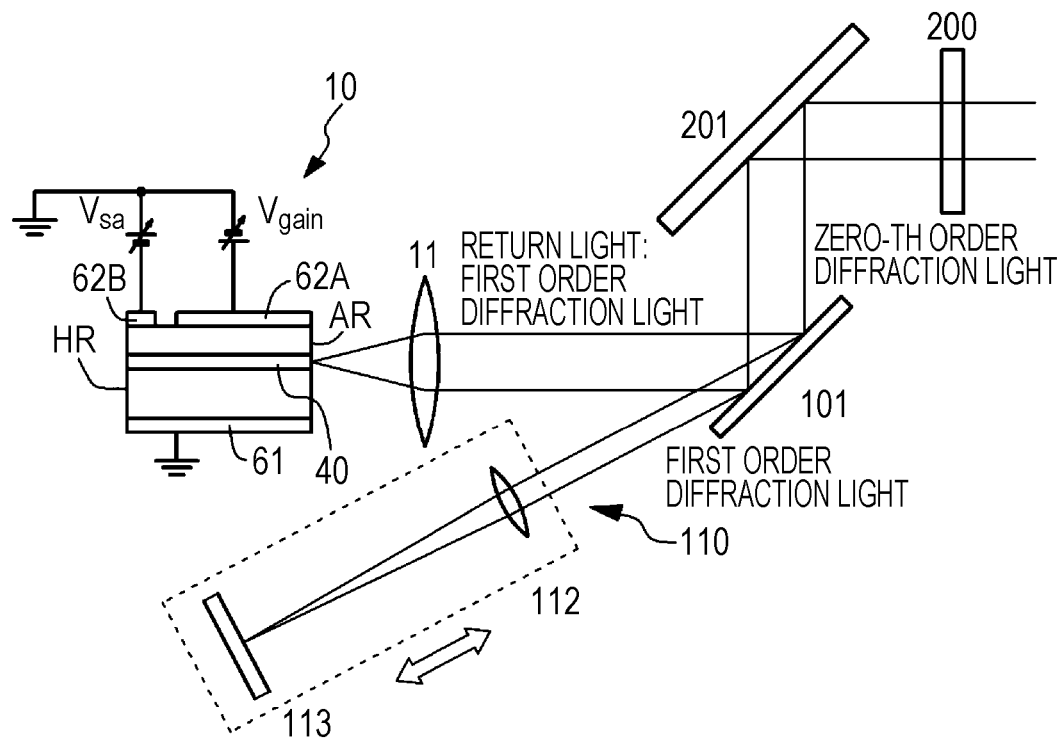
FIG. 4 is a conceptual diagram illustrating a semiconductor laser device assembly according to a second example.

The second example is a modification of the first example. A semiconductor laser device assembly according to the second example is the semiconductor laser device assembly of the first configuration including the dispersion compensation optical system and the semiconductor laser device assembly of the second configuration including the dispersion compensation optical system. Specifically, as illustrated in a conceptual diagram of FIG. 4, the semiconductor laser device assembly according to the second example further includes a dispersion compensation optical system 110 which a laser beam emitted from a semiconductor laser element is incident on and is emitted from and a diffraction grating 101 configures a part of the dispersion compensation optical system 110. In the second example, the mode synchronization semiconductor laser element 10 is a mode synchronization semiconductor laser element of a current injection type and passive mode synchronization in which a light density is $1 \times 10^{10}$ watt/cm² or more, preferably, $1.4 \times 10^{10}$ watt/cm² or more and a carrier density is $1 \times 10^{19}$/cm³ or more. In addition, when a group velocity dispersion value of the dispersion compensation optical system 110 is changed monotonously from a first predetermined value $GVD_1$ to a second predetermined value $GVD_2$ (however, $|GVD_2| < |GVD_1|$), a pulse time width of a laser beam output from the mode synchronization semiconductor laser element 10 to the outside (the outside of a system) decreases, is more than a minimum value $PW_{min}$, and increases.

Here, the group velocity dispersion value in the dispersion compensation optical system 110 is a negative value. That is, because $0 > GVD_1 > GVD_2$ is satisfied, the group velocity dispersion value of the dispersion compensation optical system 110 is decreased monotonously from the first predetermined value $GVD_1$ to the second predetermined value $GVD_2$.

In the second example, the dispersion compensation optical system 110 includes a diffraction grating (or an optical element) 101 of a holographic type having the same configuration as the first example, a condensing unit (specifically, a lens) 112, and a reflection mirror (a plane reflection mirror, specifically, a dielectric multilayer film reflection mirror) 113. In addition, the laser beam emitted from the mode synchronization semiconductor laser element 10 is incident on the dispersion compensation optical system 110, a part of the laser beam incident on the dispersion compensation optical system 110 is emitted from the dispersion compensation optical system 110 and returns to the mode synchronization semiconductor laser element 10, and the remainder of the laser beam incident on the dispersion compensation optical system 110 is output to the outside (the outside of a system). That is, the laser beam emitted from the semiconductor laser element collides with the diffraction grating 101 and diffraction light (e.g., first order diffraction light) other than zero-th order diffraction light in the laser beam having collided with the diffraction grating 101 is incident on the reflection mirror 113 through the condensing unit 112, is reflected by the reflection mirror 113, is incident on the diffraction grating 101 via the condensing unit 112, and returns to the semiconductor laser element. Meanwhile, the zero-th order diffraction light in the laser beam having collided with the diffraction grating 101 is output to the outside. An external resonator is configured from the reflection mirror 113 and the first end face of the mode synchronization semiconductor laser element 10. An aspheric convex lens having a focal distance of 4.0 mm to be a collimating unit 11 to make the laser beam emitted from the mode synchronization semiconductor laser element 10 become a parallel light beam is arranged between the mode synchronization semiconductor laser element 10 and the diffraction grating 101. A reciprocal number $N_0$ (ruling number) of a diffraction grating cycle of the diffraction grating 101 is set to 2400 mm$^{-1}$ in the second example.

The distance between the condensing unit 112 and the reflection mirror 113 is fixed and the distance between the diffraction grating 101 and the condensing unit 112 and the reflection mirror 113 is changed using a known moving unit, so that the group velocity dispersion value (dispersion compensation amount) in the dispersion compensation optical system 110 can be changed. Specifically, the condensing unit 112 and the reflection mirror 113 are integrated and are moved on an optical axis of the condensing unit 112 (an light path of the first order diffraction light), so that dispersion is changed in the laser beam incident on the dispersion compensation optical system 110 and the laser beam emitted from the dispersion compensation optical system. In the second example, the distance between the condensing unit 112 and the reflection mirror 113 is set to 100 mm and the focal distance of the condensing unit (lens) 112 having convex power is set to 100 mm. That is, the distance between the condensing unit 112 and the reflection mirror 113 and the focal distance of the condensing unit (lens) 112 having the convex power are matched with each other and an image of the laser beam is formed in the reflection mirror 113 by the condensing unit 112. Light incident on the condensing unit 112 and light emitted from the condensing unit 112 are in a relation of incident light and emission light in a telescope having the magnification of 1.0.

For example, when the distance between the diffraction grating 101 and the condensing unit 112 is equal to the focal distance of the condensing unit 112, angle dispersion of a laser beam propagating from the diffraction grating 101 to the condensing unit 112 and a laser beam reflected by the reflection mirror 113 and incident on the diffraction grating 101 via the condensing unit 112 does not change. Therefore, in this case, a dispersion compensation amount given by the dispersion compensation optical system is zero. Meanwhile, when the distance of the diffraction grating 101 and the condensing unit 112 is longer than the focal distance of the condensing unit 112, a light path of a long wavelength component in the laser beam diffracted by the diffraction grating 101 becomes longer than a light path of a short wavelength component. In this case, negative group velocity dispersion is formed. That is, a group velocity dispersion value becomes negative. In the following description, the distance of the diffraction grating 101 and the condensing unit 112 is referred to as a "distance L". The distance L=0 mm means that the distance of the diffraction grating 101 and the condensing unit 112 is equal to the focal distance of the condensing unit 112 and a value of the distance L (L>0) means that the distance of the diffraction grating 101 and the condensing unit 112 is longer than the focal distance of the condensing unit 112 by L mm. The dispersion compensation amount is an amount proportional to the distance L to be described below. The dispersion given by the dispersion compensation optical system 110 when the distance L has a positive value is negative group velocity dispersion.

In the semiconductor laser device assembly according to the second example, a wavelength selecting unit 200 is further included. In addition, the wavelength selecting unit 200 extracts a short wavelength component of a laser beam output to the outside of a system. Specifically, the wavelength selecting unit 200 is configured from a band-pass filter. Thereby, an incoherent light pulse component is removed and a coherent light pulse can be obtained. The band-pass filter can be obtained by laminating a dielectric thin film having low permittivity and a dielectric thin film having high permittivity. Even in the semiconductor laser device assembly according to the first example, the wavelength selecting unit 200 may be included.

However, it is necessary to inject (excite) carriers of a high density into the active layer 40 and form an inverted distribution to obtain optical gain necessary for a laser oscillation. Here, when the semiconductor laser element is configured from the GaN compound semiconductor in which effective mass of electrons and holes is large, a carrier density of the active layer 40 needs to be more than $10^{19}/cm^3$ to make the optical gain take a positive value (e.g., refer to "Wide-Gap Semiconductor Optical/Electronic Device" written and edited by Kiyoshi Takahashi, Akihiko Yoshikawa, and Fumio Hasegawa and published by Morikita Publishing Co., Ltd., p. 124-126). For example, the inverted distribution carrier density is high by about one digit as compared with the semiconductor laser element configured from the GaAs compound semiconductor disclosed in Non-Patent Document 1 described above and it is necessary to inject carriers of a very high density when the semiconductor laser element configured from the GaN compound semiconductor is oscillated. In the mode synchronization semiconductor laser element according to the second example, the carrier density (inverted distribution carrier density) is assumed as about $1.7 \times 10^{19}/cm^3$.

Figure 15B:
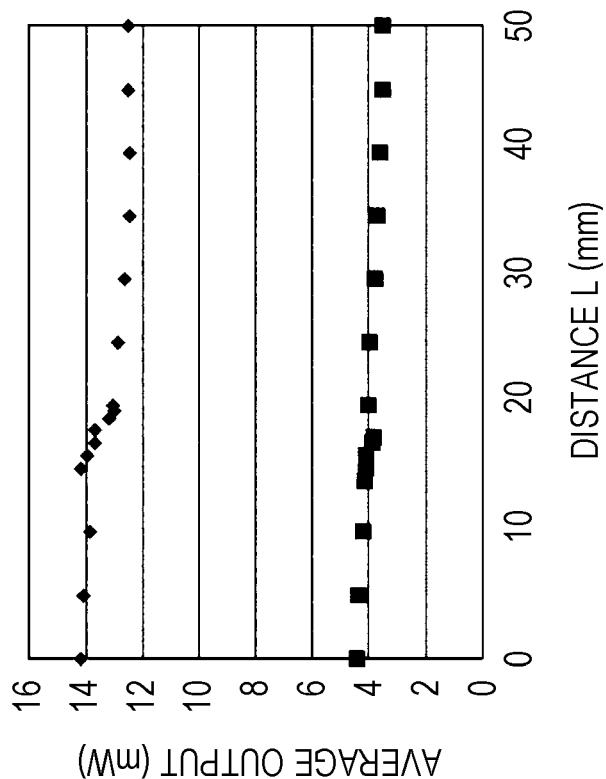
FIGS. 15A and 15B are diagrams illustrating an acquisition result of a relation of a distance L and a full width at half maximum in a light pulse and an acquisition result of a relation of the distance L and an average output in the semiconductor laser device assembly according to the second example.
Figure 15A:
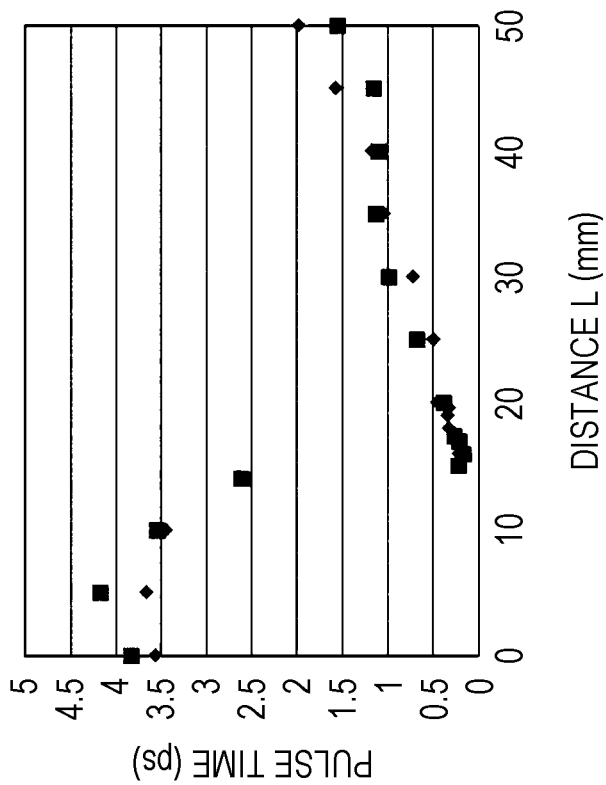

An acquisition result of a relation of a distance L and a full width at half maximum in a light pulse under conditions of a reverse bias voltage $V_{sa}=-7$ V and a gain current I=130 mA in the semiconductor laser device assemblies according to the example 1D and the comparative example 1D is illustrated in FIG. 15A and an acquisition result of a relation of the distance L and an average output is illustrated in FIG. 15B. In FIGS. 15A and 15B, a lozenge mark shows data of the example 1D and a square mark shows data of the comparative example 1D. Here, a relation of a group velocity dispersion value $(ps^2)=-5.352\times10^{-3}\times L$ (mm) exists between the distance L and the group velocity dispersion value. In addition, the group velocity dispersion value is generally given by $$-(\lambda^3/(\pi \cdot c^2 \cdot d_G^2 \cdot \cos^2\theta_r) \cdot 2 \cdot L.$$

$\lambda$: wavelength
c: light velocity
$d_G$: interval of groove of diffraction grating
$\theta_r$: angle of diffraction light with respect to normal of diffraction grating From FIG. 15A, it is known that the full width at half maximum in the pulse decreases toward the certain distance L and takes a minimum value. The dispersion compensation amount is referred to as a dispersion compensation amount ("dispersion compensation minimum value") corresponding to the minimum value of the full width at half maximum in the pulse. In an example illustrated in FIG. 15A, it is known that a side pulse appears by a slight change of a dispersion compensation amount corresponding to a value similar to the distance L=15 mm. In addition, in dispersion compensation amounts larger than the dispersion compensation minimum amount, a change in the full width at half maximum in the pulse respect to the dispersion compensation amount is smaller than a change in a full width at half maximum in a pulse in a range of dispersion compensation amounts smaller than the dispersion compensation minimum amount. In addition, in a range of the dispersion compensation amounts larger than the dispersion compensation minimum amount, a chirp of a pulse generated by changing the dispersion compensation amount can be adjusted. A light pulse in which a full width at half maximum in the pulse is a minimum value is made to pass through the wavelength selecting unit 200 and only a short wavelength component is extracted, so that a correlation waveform showing a non-hemmed clean light pulse can be obtained. In addition, at a negative-side group velocity dispersion value from group velocity dispersion values at which a pulse time width is minimized, a correlation waveform showing a non-hemmed clean light pulse can be obtained. In the example 1D and the comparative example 1D, a difference in the full width at half maximum in the pulse is not permitted. Meanwhile, as illustrated in FIG. 15B, an average output in the example 1D is about three times larger than an average output in the comparative example 1D.

As a result obtained by measuring the electric resistance value between the second portion 62A and the second portion 62B of the second electrode 62 of the manufactured mode synchronization semiconductor laser element 10 by a four-terminal method, when the width of the separation groove 62C is 20 μm, the electric resistance value between the first portion 62A and the second portion 62B of the second electrode 62 is 15 kΩ. In addition, in the manufactured mode synchronization semiconductor laser element 10, the direct current is flown from the first portion 62A of the second electrode 62 to the first electrode 61 via the light emission region 41 to enter a forward bias state and a reverse bias voltage $V_{sa}$ is applied between the first electrode 61 and the second portion 62B of the second electrode 62 to apply a field to the saturable absorption region 42, thereby executing a self-pulsation operation. That is, the electric resistance value between the first portion 62A and the second portion 62B of the second electrode 62 is 1×10 times or more larger than an electric resistance value between the second electrode 62 and the first electrode 61 or is $1 \times 10^2 \Omega$ or more. Therefore, a leakage current can be surely suppressed from flowing from the first portion 62A of the second electrode 62 to the second portion 62B. As a result, the light emission region 41 can enter the forward bias state and the saturable absorption region 42 can surely enter the reverse bias state, thereby surely generating a self-pulsation operation of a single mode.

Third Example

The third example is a modification of the mode synchronization semiconductor laser element described in the first example and relates to a mode synchronization semiconductor laser element of a third configuration. In the first example, the mode synchronization semiconductor laser element 10 is provided on a (0001) plane of the n-type GaN substrate 21 to be a crystal plane having polarity, that is, a C plane. However, when the substrate is used, it may be difficult to electrically control saturable absorption by a QCSE effect (quantum confined Stark effect) by an internal field due to piezo polarization and spontaneous polarization in the active layer 40. That is, in some cases, it is known that it is necessary to increase a value of a direct current flown to the first electrode and a value of the reverse bias voltage applied to the saturable absorption region to obtain the self-pulsation operation and the mode synchronization operation, a subpulse component associated with a main pulse is generated, and it is difficult to synchronize the external signal and the light pulse.

In addition, it is determined that optimization of the thickness of the well layer configuring the active layer 40 and optimization of an impurity doping concentration in the barrier layer configuring the active layer 40 are preferably realized to prevent the above phenomenon from occurring.

Specifically, the thickness of the well layer configuring the GaInN quantum active layer is 1 nm to 10.0 nm, preferably, 1 nm to 8 nm. As such, the thickness of the well layer is decreased, so that influences of piezo polarization and spontaneous polarization can be decreased. In addition, an impurity doping concentration of the barrier layer is $2 \times 10^{18}$ cm$^{-3}$ to $1 \times 10^{20}$ cm$^{-3}$, preferably, $1 \times 10^{19}$ cm$^{-3}$ to $1 \times 10^{20}$ cm$^{-3}$. Here, silicon (Si) or oxygen (O) can be exemplified as the impurities. In addition, the impurity doping concentration of the barrier layer is set to the above concentration, so that carriers of the active layer can be increased. As a result, the influences of the piezo polarization and the spontaneous polarization can be decreased.

In the third example, the configuration of the active layer 40 configured from the GaInN quantum well active layer configured from the barrier layers (configured from Ga$_{0.98}$In$_{0.02}$N) of the three layers and the well layers (Ga$_{0.92}$In$_{0.08}$N) of the two layers in the layer configuration illustrated in Table 3 is as follows. In addition, in a mode synchronization semiconductor laser element according to a third reference example, the configuration of the active layer 40 in the layer configuration illustrated in Table 3 is as follows. Specifically, the same configuration as the first example is adopted.

TABLE 3

|  | third example | third reference example |
|---|---|---|
| well layer, | 8 nm | 10.5 nm |
| barrier layer | 12 nm | 14 nm |
| impurity doping concentration of well layer | non-doping | non-doping |
| impurity doping concentration of barrier layer | Si:S × 10$^{18}$ cm$^{-3}$ | non-doping |

In the third example, the thickness of the well layer is 8 nm, Si of $2 \times 10^{18}$ cm$^{-3}$ is doped into the barrier layer, and the QCSE effect in the active layer is alleviated. Meanwhile, in the third reference example, the thickness of the well layer is 10.5 nm and impurities are not doped into the barrier layer.

Similar to the first example, the mode synchronization is determined by the direct current applied to the light emission region and the reverse bias voltage $V_{sa}$ applied to the saturable absorption region. Reverse bias voltage dependency of a relation (L-I characteristic) of an injection current and a light output according to the third example and the third reference example is measured. As a result, in the third reference example, if the reverse bias voltage $V_{sa}$ increases, a threshold current where the laser oscillation starts gradually increases and a change is generated by the low reverse bias voltage $V_{sa}$, as compared with the third example. This shows that a saturable absorption effect in the active layer according to the third example is electrically controlled by the reverse bias voltage $V_{sa}$. However, in the third reference example, the self-pulsation operation and the mode synchronization (mode locking) operation of the single mode (single fundamental lateral mode) are confirmed in a state in which the reverse bias is applied to the saturable absorption region and the third reference example is also included in the present disclosure.

Fourth Example

The fourth example is a modification of the first to third examples. In the fourth example, a wavelength selecting unit can be configured from a diffraction grating 210 and an aperture 211 to select diffraction light (in the fourth example, first order diffraction light) of first order or more emitted from the diffraction grating 210, as illustrated in conceptual diagrams of FIGS. 5A and 5B, instead of the wavelength selecting unit being configured from a band-pass filter. For example, the aperture 211 is configured from a transmissive liquid crystal display device 212 having multiple segments.

A lens 213 is arranged between the diffraction grating 210 and the aperture 211. In addition, the diffraction grating 210 is preferably arranged, such that an extension direction of a diffraction surface of the diffraction grating 210 and a main vibration direction of a field of a laser beam (zero-th order diffraction light output from the diffraction grating 101) incident on the diffraction grating 210 are substantially vertical to each other.

Figure 5A:
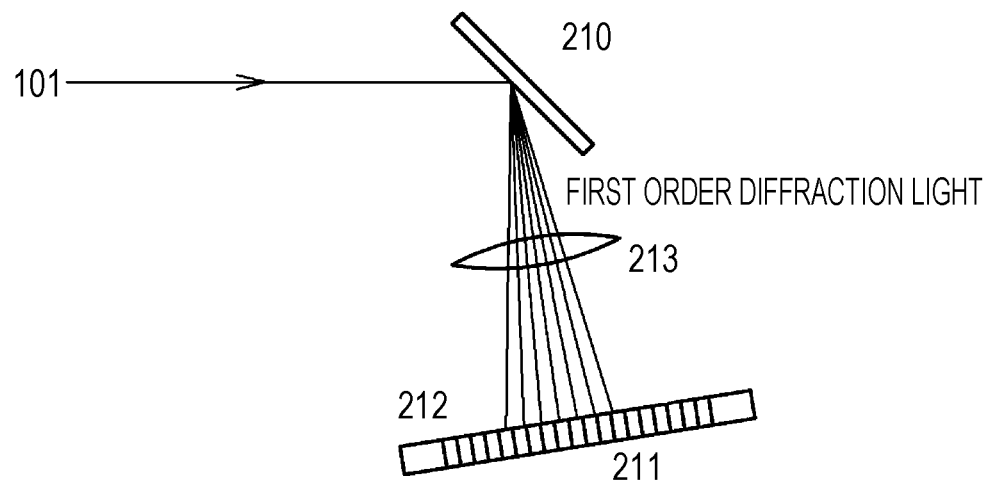
FIGS. 5A and 5B are conceptual diagrams illustrating a wavelength selecting unit in a semiconductor laser device assembly according to a fourth example.
Figure 5B:
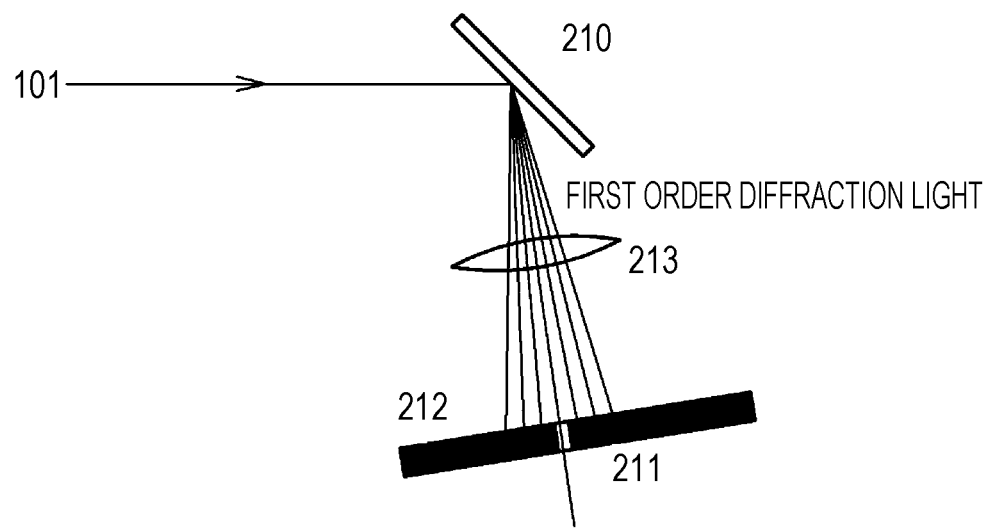

A wavelength of the laser beam emitted from the mode synchronization semiconductor laser element 10 has a certain wavelength range. Therefore, the first order diffraction light diffracted in the diffraction grating 101 can collide with the aperture 211 in multiple regions, as illustrated in FIG. 5A. That is, in the expression (A) described above, because a plurality of angles α exist, a plurality of angles β exist. In FIGS. 5A and 5B, convergence and emission of a light path by the lens 213 are ignored. In addition, illustration of the zero-th order diffraction light emitted from the diffraction grating 101 is also omitted. Here, as illustrated in FIG. 5B, a laser beam is transmitted in a desired segment (configuring the aperture 211) of the transmissive liquid crystal display device 212 having the multiple segments, so that only a laser beam emitted from the mode synchronization semiconductor laser element 10 and having a desired wavelength is finally output to the outside. As such, a wavelength can be selected by selecting the aperture 211.

The present disclosure has been described on the basis of the preferred examples. However, the present disclosure is not limited to these examples. The configurations and the structures of the semiconductor laser device assemblies and the mode synchronization semiconductor laser elements described in the examples are exemplary and can be appropriately changed. In addition, in the examples, various values are shown, but these values are exemplary. For example, if the specification of the semiconductor laser element to be used is changed, the change is natural. In the examples, only the mode synchronization semiconductor laser element is used as the semiconductor laser element. However, the semiconductor laser element is not limited thereto. In addition, in the examples, the optical element is configured from the diffraction grating. However, an element using photonic crystal or a metal plasmon phenomenon, an output coupler, and a volume grating can be exemplified. In addition, a diffraction grating of a transmission type as well as the diffraction grating of the reflection type can be used as the diffraction grating.

Figure 8:
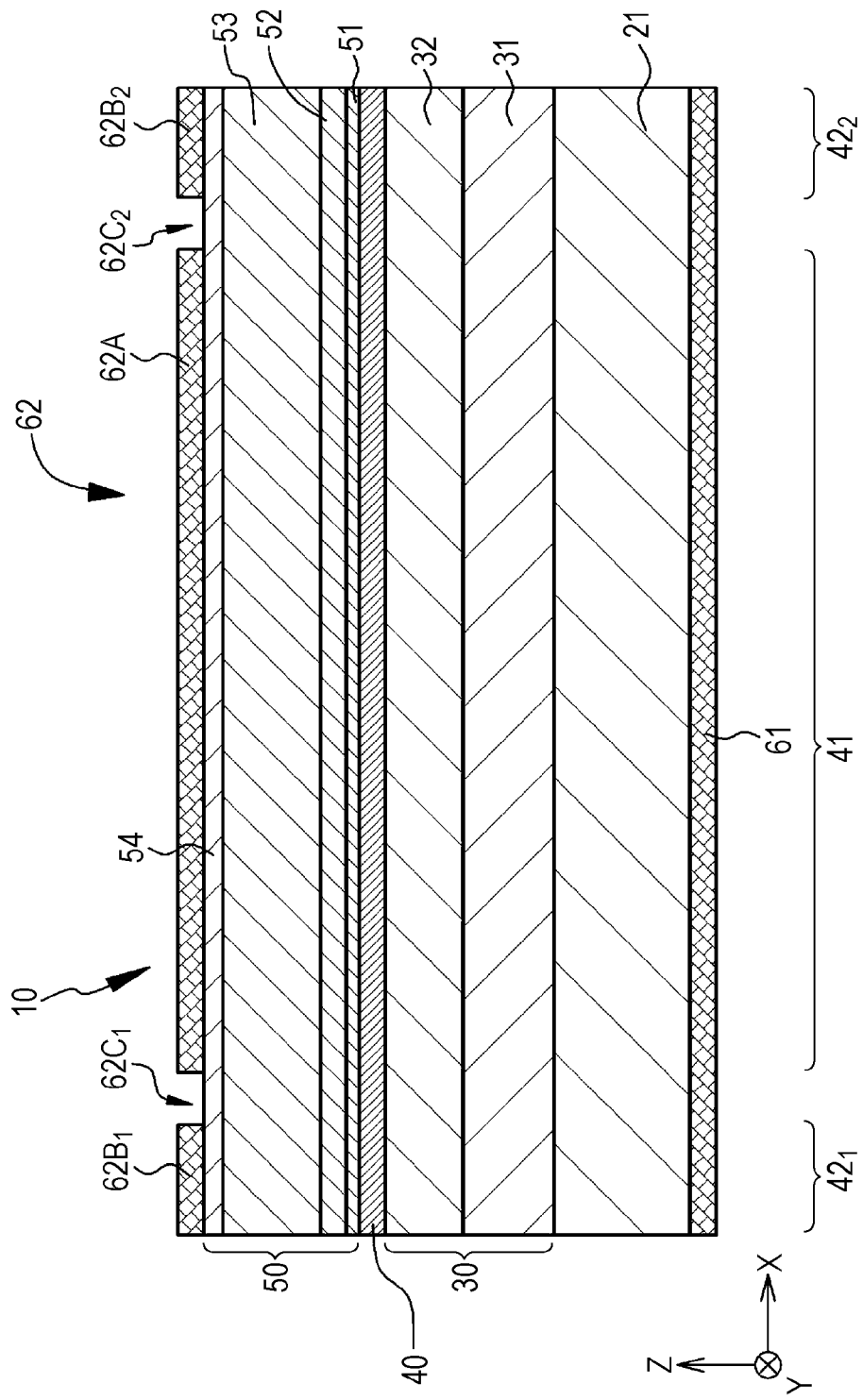
FIG. 8 is a schematic end view taken along an extension direction of a resonator according to a modification of a mode synchronization semiconductor laser element according to the first example.
Figure 9:
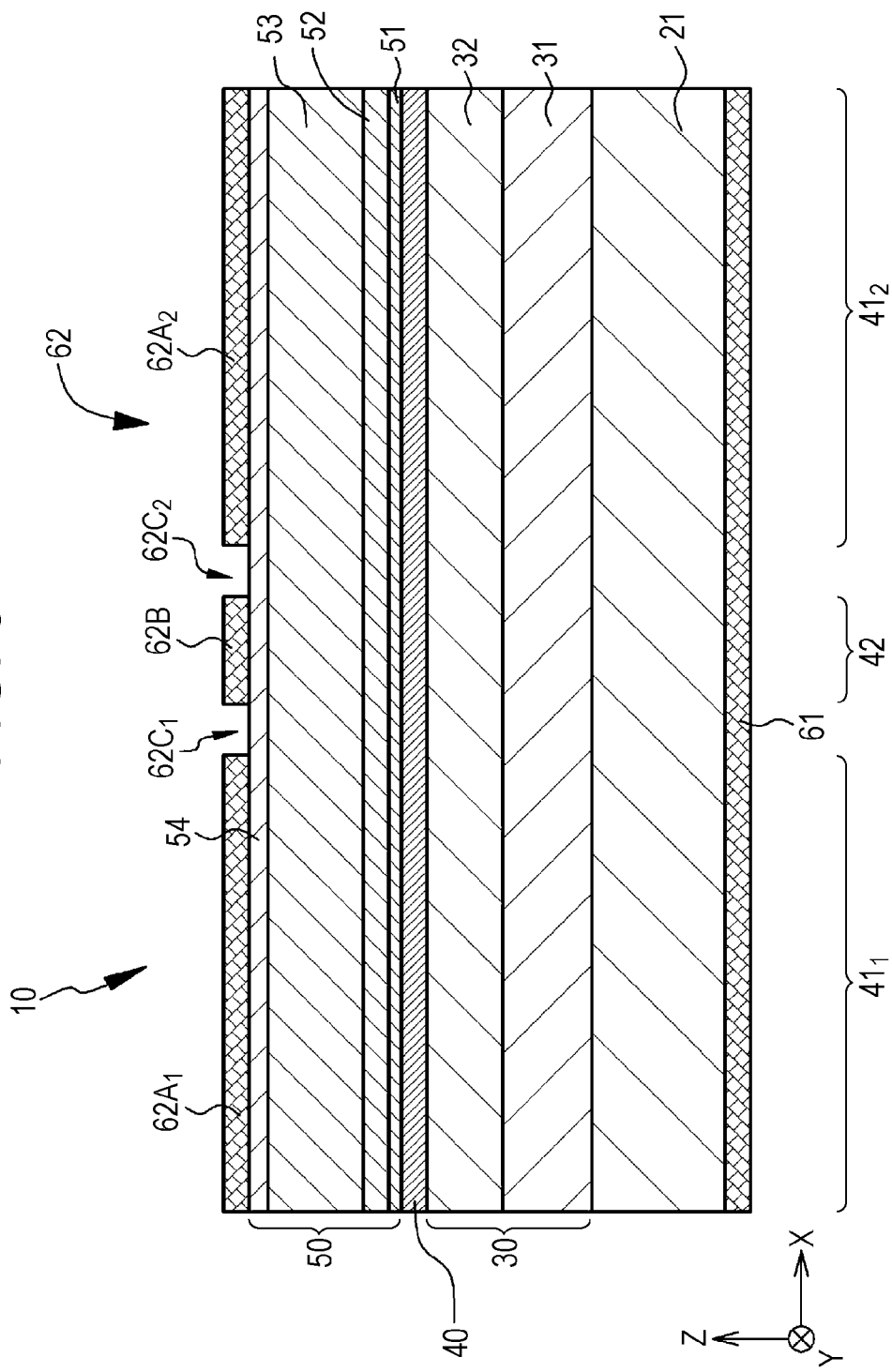
FIG. 9 is a schematic end view taken along an extension direction of a resonator according to another modification of the mode synchronization semiconductor laser element according to the first example.

The number of light emission regions 41 or saturable absorption regions 42 is not limited to 1. A schematic end view of a mode synchronization semiconductor laser element (semiconductor laser element of a multi-section type (multi-electrode type)) in which a first portion 62A of one second electrode and second portions $62B_1$ and $62B_2$ of two second electrodes are provided is illustrated in FIGS. 8 and 9. In the mode synchronization semiconductor laser element illustrated in FIG. 8, one end of the first portion 62A faces one second portion $62B_1$ with one separation groove $62C_1$ therebetween and the other end of the first portion 62A faces the other second portion $62B_2$ with the other separation groove $62C_2$ therebetween. In addition, one light emission region 41 is interposed by two saturable absorption regions $42_2$ and $42_2$. In addition, a schematic end view of a mode synchronization semiconductor laser element in which first portions $62A_1$ and $62A_2$ of two second electrodes and a second portion 62B of one second electrode are provided is illustrated in FIG. 9. In the mode synchronization semiconductor laser element, one end of the second portion 62B faces one first portion $62A_1$ with one separation groove $62C_1$ therebetween and the other end of the second portion 62B faces the other first portion $62A_2$ with the other separation groove $62C_2$ therebetween. In addition, one saturable absorption region 42 is interposed by two light emission regions $41_1$ and $41_2$.

Figure 10:
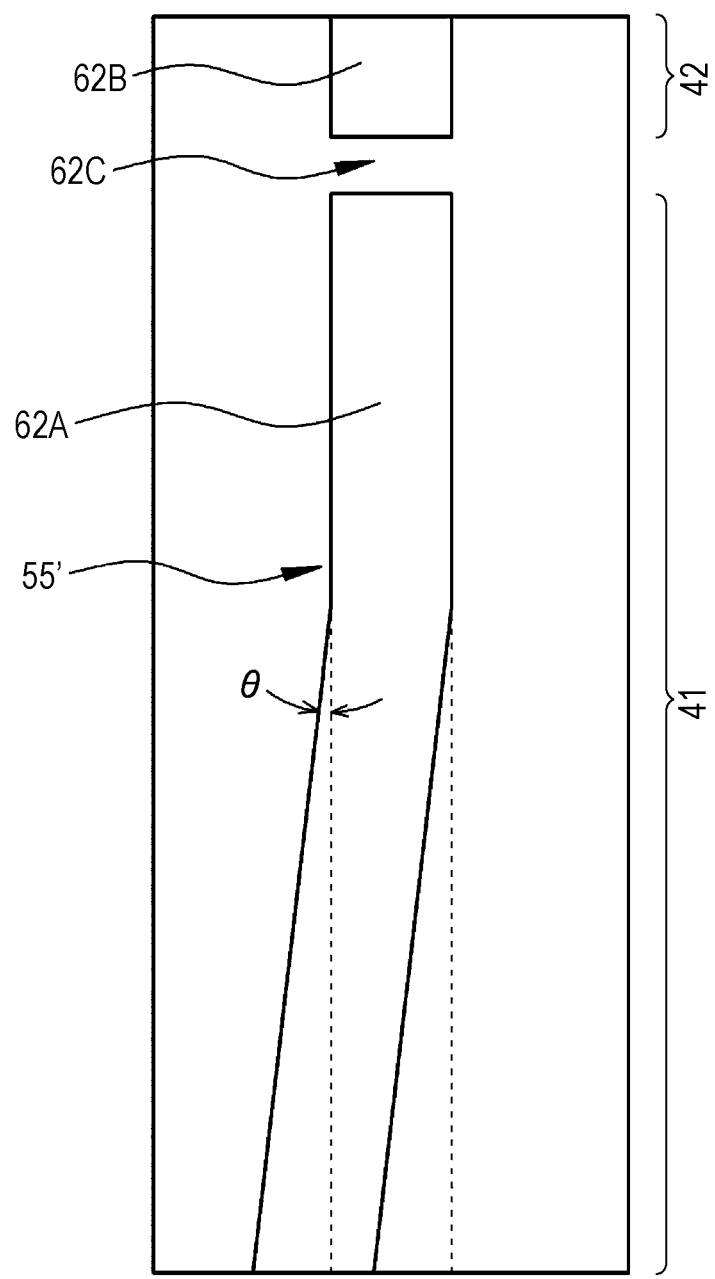
FIG. 10 is a schematic top view of a ridge stripe structure in still another modification of the mode synchronization semiconductor laser element according to the first example.

The mode synchronization semiconductor laser element can be configured as a semiconductor laser element of a separate confinement heterostructure of an oblique ridge stripe type having an oblique waveguide. A schematic top view of a ridge stripe structure 55' in the mode synchronization semiconductor laser element is illustrated in FIG. 10. The mode synchronization semiconductor laser element has a structure in which two linear ridge stripe structures are combined and a value of a crossing angle θ of the two ridge stripe structures is 0<θ≤10(°), preferably, 0<θ≤6(°). By adopting the oblique ridge stripe type, reflectance of a non-reflection coated second end face can be approximated to an ideal value of 0%. As a result, generation of a laser beam moving around an inner portion of the mode synchronization semiconductor laser element can be prevented and generation of a secondary laser beam associated with a main laser beam can be suppressed.

In the examples, the mode synchronization semiconductor laser element 10 is provided on a C plane to be a polar plane of the n-type GaN substrate 21, that is, a {0001} plane. However, the mode synchronization semiconductor laser element 10 may be provided on a non-polar plane such as an A plane to be a {11-20} plane, an M plane to be a {1-100} plane, and a {1-102} plane or a semi-polar plane such as a {11-2n} plane including planes such as a {11-24} plane and a {11-22} plane, a {10-11} plane, and a {10-12} plane. Thereby, even when the piezo polarization and the spontaneous polarization are generated in the third compound semiconductor layer of the mode synchronization semiconductor laser element 10, the piezo polarization is not generated in the thickness direction of the third compound semiconductor layer and the piezo polarization is generated in a direction substantially orthogonal to the thickness direction of the third compound semiconductor layer. Therefore, a bad influence resulting from the piezo polarization and the spontaneous polarization can be removed. The {11-2n} plane means a non-polar plane that forms an angle of about 40 degrees with respect to the C plane. In addition, when the mode synchronization semiconductor laser element 10 is provided on the non-polar plane or the semi-polar plane, the limitation (1 nm to 10 nm) in the thickness of the well layer and the limitation ($2\times10^{18}$ cm$^{-3}$ to $1\times10^{20}$ cm$^{-3}$) in the impurity doping concentration of the barrier layer as described in the third example can be removed.

In addition, the present disclosure can take the following configurations.

[1] <<Semiconductor Laser Device Assembly: First Aspect>>

A semiconductor laser device assembly including:

(A) a semiconductor laser element; and (B) a diffraction grating that configures an external resonator, returns diffraction light other than zero-th order diffraction light to the semiconductor laser element, and outputs the zero-th order diffraction light to the outside, wherein an extension direction of a diffraction surface of the diffraction grating and a main vibration direction of a field of a laser beam incident on the diffraction grating are substantially parallel to each other.

[2] The semiconductor laser device assembly according to [1], wherein the semiconductor laser element is driven to execute an active mode synchronization operation or a passive mode synchronization operation.

[3] The semiconductor laser device assembly according to [1] or [2], wherein a reciprocal number $N_0$ of a diffraction grating cycle of the diffraction grating is $1.0 \times 10^3$ mm$^{-1}$ or more.

[4] The semiconductor laser device assembly according to any one of [1] to [3], wherein the diffraction grating is configured from a diffraction grating of a reflection type and a blaze type.

[5] The semiconductor laser device assembly according to [4], wherein a blaze wavelength in the diffraction grating is equal to or less than a wavelength of a laser beam incident on the diffraction grating.

[6] The semiconductor laser device assembly according to [4] or [5], wherein the diffraction grating is arranged in a Littrow arrangement.

[7] The semiconductor laser device assembly according to any one of to [3], wherein, when an incidence angle of a laser beam (wavelength: λ nm) emitted from the semiconductor laser element and incident on the diffraction grating is set to $\Phi_{in}$, an emission angle is set to $\Phi_{out}$, a reciprocal number of a diffraction grating cycle of the diffraction grating is set to $N_0$ (unit: mm$^{-1}$), a sign of an angle of a clockwise direction with respect to a normal of the diffraction grating is positive, and a laser beam is incident at a positive angle, an emission angle $\Phi_{out}$ of plus first order diffraction light satisfies a relation of the following expression (1), an emission angle $\Phi_{out}$ of minus first order diffraction light satisfies a relation of the following expression (2), and an emission angle $\Phi_{out}$ of plus second order diffraction light satisfies a relation of the following expression (3), so that the plus first order diffraction light in the laser beam having collided with the diffraction grating returns to the semiconductor laser element.

$$-90 < \Phi_{out} = \sin^{-1}[N_0 \cdot (+1) \cdot \lambda - \sin(\Phi_{in})] < 90 \quad (1)$$

$$\Phi_{out} = \sin^{-1}[N_0 \cdot (-1) \cdot \lambda - \sin(\Phi_{in})] \leq -90 \quad (2)$$

$$\Phi_{out} = \sin^{-1}[N_0 \cdot (+2) \cdot \lambda - \sin(\Phi_{in})] \geq 90 \quad (3)$$

[8] The semiconductor laser device assembly according to any one of [1] to [7], further including:
a dispersion compensation optical system which the laser beam emitted from the semiconductor laser element is incident on or is emitted from, and
wherein the diffraction grating configures a part of the dispersion compensation optical system.

[9] The semiconductor laser device assembly according to [8],
wherein the dispersion compensation optical system is further configured from a reflection mirror, and
the laser beam emitted from the semiconductor laser element collides with the diffraction grating, the diffraction light other than the zero-th order diffraction light in the laser beam having collided with the diffraction grating is incident on the reflection mirror, is reflected by the reflection mirror, is incident on the diffraction grating, and returns to the semiconductor laser element, and the zero-th order diffraction light in the laser beam having collided with the diffraction grating is output to the outside.

[10] The semiconductor laser device assembly according to any one of [1] to [9], further including:
a wavelength selecting unit that selects a wavelength of the zero-th order diffraction light emitted to the outside.

[11] The semiconductor laser device assembly according to any one of [1] to [10],
wherein extraction efficiency of a laser beam component having a field included in a plane parallel to a principal surface of the semiconductor laser element to the outside is higher than extraction efficiency of a laser beam component having a field orthogonal to the principal surface of the semiconductor laser element to the outside.

[12] The semiconductor laser device assembly according to any one of [1] to [11], further including:
a half-wavelength plate that is arranged between the semiconductor laser element and the diffraction grating,
wherein, when an axial direction of the semiconductor laser element is set to an X direction, a thickness direction is set to a Z direction, and a width direction is set to a Y direction, a main vibration of a field of the laser beam emitted from the semiconductor laser element is included in an XY plane,
a main vibration of a field of a laser beam having passed through the half-wavelength plate is included in an XZ plane, and
when the extension direction of the diffraction surface of the diffraction grating is projected on a plane equivalent to a YZ plane, the extension direction of the diffraction surface of the diffraction grating is substantially parallel to the Z direction.

[13] <<Semiconductor Laser Device Assembly: Second Aspect>>
A semiconductor laser device assembly including:
(A) a semiconductor laser element; and
(B) an optical element that configures an external resonator, returns a part of an incident laser beam to the semiconductor laser element, and outputs the remainder of the incident laser beam to the outside,
wherein extraction efficiency of a laser beam component having a field included in a plane parallel to a principal surface of the semiconductor laser element to the outside is higher than extraction efficiency of a laser beam component having a field orthogonal to the principal surface of the semiconductor laser element to the outside.

[14] The semiconductor laser device assembly according to any one of [1] to [12],
wherein the semiconductor laser element is configured from a mode synchronization semiconductor laser element of a current injection type in which a light density is $1 \times 10^{10}$ watt/cm$^2$ or more and a carrier density is $1 \times 10^{19}$/cm$^3$ or more,
the semiconductor laser device assembly further includes a dispersion compensation optical system which a laser beam emitted from the mode synchronization semiconductor laser element is incident on and is emitted from, and
the dispersion compensation optical system is configured by a diffraction grating.

[15] The semiconductor laser device assembly according to [14],
wherein the mode synchronization semiconductor laser element has a saturable absorption region.

[16] The semiconductor laser device assembly according to [14] or [15],
wherein a group velocity dispersion value in the dispersion compensation optical system is a negative value.

[17] The semiconductor laser device assembly according to any one of [14] to [16],
wherein an operation is executed at a group velocity dispersion value at which a pulse time width of a laser beam output to the outside of a system becomes a minimum value or a value similar thereto.

[18] The semiconductor laser device assembly according to any one of [14] to [17], further including:
a wavelength selecting unit,
wherein the wavelength selecting unit extracts a short wavelength component of the laser beam output to the outside of the system.

[19] The semiconductor laser device assembly according to any one of [14] to [18], wherein the laser beam emitted from the mode synchronization semiconductor laser element is incident on the dispersion compensation optical system, and a part of the laser beam incident on the dispersion compensation optical system is emitted from the dispersion compensation optical system and returns to the mode synchronization semiconductor laser element and the remainder of the laser beam incident on the dispersion compensation optical system is output to the outside of the system.

[20] The semiconductor laser device assembly according to any one of [1] to [12], wherein the semiconductor laser element is configured from a mode synchronization semiconductor laser element of a current injection type, the semiconductor laser device assembly further includes a dispersion compensation optical system which a laser beam emitted from the mode synchronization semiconductor laser element is incident on and is emitted from, and when a group velocity dispersion value of the dispersion compensation optical system is changed monotonously from a first predetermined value $GVD_1$ to a second predetermined value $GVD_2$ (however, $|GVD_1|<|GVD_2|$), a pulse time width of a laser beam output from the mode synchronization semiconductor laser element to the outside of a system decreases, is more than a minimum value $PW_{min}$, and increases.

[21] The semiconductor laser device assembly according to [20], wherein an operation is executed at a group velocity dispersion minimum value $GVD_{min}$ at which the pulse time width of the laser beam output to the outside of the system becomes the minimum value $PW_{min}$ or a value similar thereto.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST

10 Mode synchronization semiconductor laser element
10' Supporting member
11 Collimating unit
21 n-type GaN substrate
22 GaN buffer layer
30 First compound semiconductor layer
31 n-type AlGaN cladding layer
32 n-type GaN cladding layer
40 Third compound semiconductor layer (active layer)
41, $41_1$, $41_2$ Light emission region
42, $42_1$, $42_2$ Saturable absorption region
50 Second compound semiconductor layer
51 Non-doping GaInN light guide layer
52 p-type AlGaN electron barrier layer (Mg doping)
53 p-type GaN (Mg doping)/AlGaN super lattice cladding layer
54 p-type GaN contact layer (Mg doping)
55, 55' Ridge stripe structure
56 Laminated insulating film
61 First electrode
62 Second electrode
62A, $62A_1$, $62A_2$ First portion of second electrode
62B, $62B_1$, $62B_2$ Second portion of second electrode
62C, $62C_1$, $62C_2$ Separation groove
63 Pd single layer
64 Resist layer
65 Opening portion
101 Diffraction grating
102 Half-wavelength plate ($\lambda/2$ wavelength plate)
103 Reflection mirror
110, 120 Dispersion compensation optical system
112 Condensing unit (lens)
113 Reflection mirror (dielectric multilayer film reflection mirror)
200 Wavelength selecting unit (wavelength selecting device)
201 Plane mirror
210 Diffraction gating configuring wavelength selecting unit
211 Aperture
212 Transmissive liquid crystal display device
213 lens

The invention claimed is:

1. A semiconductor laser device assembly comprising:
a semiconductor laser element;
a diffraction grating configured to define an external resonator, return diffraction light other than zero-th order diffraction light to the semiconductor laser element, and output the zero-th order diffraction light to the outside,
wherein an extension direction of a diffraction surface of the diffraction grating and a direction of a parallel field component of a laser beam incident on the diffraction grating are substantially parallel to each other; and
a dispersion compensation optical system comprising a reflection mirror and a lens unit, and
wherein the diffraction light other than the zero-th order diffraction light, having collided with the diffraction grating, is incident on the reflection mirror through the lens unit.

2. The semiconductor laser device assembly according to claim 1, wherein the semiconductor laser element is configured to be driven to execute an active mode synchronization operation or a passive mode synchronization operation.

3. The semiconductor laser device assembly according to claim 1, wherein the diffraction grating is configured from a diffraction grating of a reflection type and a blaze type.

4. The semiconductor laser device assembly according to claim 3, wherein a blaze wavelength in the diffraction grating is equal to or less than a wavelength of a laser beam incident on the diffraction grating.

5. The semiconductor laser device assembly according to claim 3, wherein the diffraction grating is arranged in a Littrow arrangement.

6. The semiconductor laser device assembly according to claim 1,
wherein, in an event an incidence angle of a laser beam (wavelength: $\lambda$ nm) emitted from the semiconductor laser element and incident on the diffraction grating is set to $\phi_{in}$, an emission angle is set to $\phi_{out}$, a reciprocal number of a diffraction grating cycle of the diffraction grating is set to $N_0$ (unit: $mm^{-1}$), a sign of an angle of a clockwise direction with respect to a normal of the diffraction grating is positive, and a laser beam is incident at a positive angle, an emission angle $\phi_{out}$ of plus first order diffraction light satisfies a relation of the following expression (1), an emission angle $\phi_{out}$ of minus first order diffraction light satisfies a relation of the following expression (2), and an emission angle $\phi_{out}$ of plus second order diffraction light satisfies a relation of the following expression (3), so that the plus first order diffraction light in the laser beam having collided with the diffraction grating returns to the semiconductor laser element:

$$-90 < \phi_{out} = \sin^{-1}[N_0 \cdot (+1) \cdot \lambda - \sin(\phi_{in})] < 90 \quad (1)$$

$$\phi_{out} = \sin^{-1}[N_0 \cdot (-1) \cdot \lambda - \sin(\phi_{in})] \leq -90 \quad (2)$$

$$\phi_{out} = \sin^{-1}[N_0 \cdot (+2) \cdot \lambda - \sin(\phi_{in})] \geq 90 \quad (3).$$

7. The semiconductor laser device assembly according to claim 1,
wherein the diffraction grating defines a part of the dispersion compensation optical system.

8. The semiconductor laser device assembly according to claim 1,
wherein
the diffraction light other than the zero-th order diffraction light in the laser beam having collided with the diffraction grating incident on the reflection mirror, is reflected by the reflection mirror, is incident on the diffraction grating, and returns to the semiconductor laser element, and the zero-th order diffraction light in the laser beam having collided with the diffraction grating is output to the outside.

9. The semiconductor laser device assembly according to claim 1, further comprising:
a wavelength selecting unit configured to select a wavelength of the zero-th order diffraction light emitted to the outside.

10. The semiconductor laser device assembly according to claim 1,
wherein extraction efficiency of a laser beam component having a field included in a plane parallel to a principal surface of the semiconductor laser element to the outside is higher than extraction efficiency of a laser beam component having a field orthogonal to the principal surface of the semiconductor laser element to the outside.

11. The semiconductor laser device assembly according to claim 1, further comprising:
a half-wavelength plate that is arranged between the semiconductor laser element and the diffraction grating,
wherein, in an event an axial direction of the semiconductor laser element is set to an X direction, a thickness direction is set to a Z direction, and a width direction is set to a Y direction, the parallel field component of a field of the laser beam emitted from the semiconductor laser element is included in an XY plane,
the parallel field component of a field of a laser beam having passed through the half-wavelength plate is included in an XZ plane, and
in an event the extension direction of the diffraction surface of the diffraction grating is projected on a plane equivalent to a YZ plane, the extension direction of the diffraction surface of the diffraction grating is substantially parallel to the Z direction.

12. A semiconductor laser device assembly comprising:
a semiconductor laser element;
an optical element configured to define an external resonator, return a part of an incident laser beam to the semiconductor laser element, and output the remainder of the incident laser beam to the outside,
wherein extraction efficiency of a laser beam component having a field included in a plane parallel to a principal surface of the semiconductor laser element to the outside is higher than extraction efficiency of a laser beam component having a field orthogonal to the principal surface of the semiconductor laser element to the outside,
wherein the optical element includes a diffraction grating, and
wherein an extension direction of a diffraction surface of the diffraction grating and a direction of a parallel field component of a laser beam incident on the diffraction grating are substantially parallel to each other; and
a dispersion compensation optical system comprising a reflection mirror and a lens unit, and
wherein the part of the incident laser beam, having collided with the optical element, is incident on the reflection mirror through the lens unit.

13. The semiconductor laser device assembly according to claim 1, wherein a diffraction grating cycle number of the diffraction grating is from 2400 mm$^{-1}$ to 3600 mm$^{-1}$.

* * * * *